United States Patent
Asano

(10) Patent No.: US 7,582,889 B2
(45) Date of Patent: Sep. 1, 2009

(54) ELECTRICALLY REWRITABLE NON-VOLATILE MEMORY ELEMENT AND METHOD OF MANUFACTURING THE SAME

(75) Inventor: Isamu Asano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 281 days.

(21) Appl. No.: 11/594,747

(22) Filed: Nov. 9, 2006

(65) Prior Publication Data
US 2007/0123018 A1    May 31, 2007

(30) Foreign Application Priority Data
Nov. 28, 2005    (JP) .............................. 2005-341476

(51) Int. Cl.
*H01L 47/00* (2006.01)
(52) U.S. Cl. .................................. 257/4; 257/E45.002
(58) Field of Classification Search .................... 257/2, 257/3, 4, 5, E45.002; 365/148, 163
See application file for complete search history.

(56) References Cited

U.S. PATENT DOCUMENTS

2005/0110983 A1    5/2005    Jeong et al.

2007/0123018 A1*    5/2007    Asano ........................ 438/597

OTHER PUBLICATIONS

Y. N. Hwang, et al. "Writing Current Reduction for High-density Phase-change RAM" 2003 IEEE.
Y. H. Ha, et al. "An Edge Contact Type Cell for Phase Change RAM Featuring Very Low Power Consumption" 2003 Symposium on VLSI Technology Digest of Technical Papers.
Chinese Office Action, with English translation, issued in Chinese Patent Application No. CN 200610163004.7, mailed Nov. 7, 2008.

* cited by examiner

*Primary Examiner*—Mark Prenty
(74) *Attorney, Agent, or Firm*—McDermott Will & Emery LLP

(57) ABSTRACT

A non-volatile memory element includes a lower electrode, an upper electrode, a recording layer arranged between the lower electrode and the upper electrode and containing a phase change material, and a bit line directly arranged on the upper electrode. The bit line is formed to be offset to the recording layer. With this arrangement, a contact area between the recording layer and the upper electrode and a contact area between the upper electrode and the bit line can be reduced without providing an interlayer insulation film between the upper electrode and the bit line. Thus, heat radiation to the bit line can be suppressed while the upper electrode and the bit line are connected without using a through-hole.

13 Claims, 20 Drawing Sheets

ELECTRICALLY REWRITABLE NON-VOLATILE MEMORY ELEMENT AND METHOD OF MANUFACTURING THE SAME

TECHNICAL FIELD

The present invention relates to an electrically rewritable non-volatile memory element and to a method of manufacturing the element. More specifically, the present invention relates to an electrically rewritable non-volatile memory element having a recording layer that includes phase change material, and to a method of manufacturing the element.

BACKGROUND OF THE INVENTION

Personal computers and servers and the like use a hierarchy of memory devices. There is lower-tier memory, which is inexpensive and provides high storage capacity, while memory higher up the hierarchy provides high-speed operation. The bottom tier generally consists of magnetic storage such as hard disks and magnetic tape. In addition to being non-volatile, magnetic storage is an inexpensive way of storing much larger quantities of information than solid-state devices such as semiconductor memory. However, semiconductor memory is much faster and can access stored data randomly, in contrast to the sequential access operation of magnetic storage devices. For these reasons, magnetic storage is generally used to store programs and archival information and the like, and, when required, this information is transferred to main system memory devices higher up in the hierarchy.

Main memory generally uses dynamic random access memory (DRAM) devices, which operate at much higher speeds than magnetic storage and, on a per-bit basis, are cheaper than faster semiconductor memory devices such as static random access memory (SRAM) devices.

Occupying the very top tier of the memory hierarchy is the internal cache memory of the system microprocessor unit (MPU). The internal cache is extremely high-speed memory connected to the MPU core via internal bus lines. The cache memory has a very small capacity. In some cases, secondary and even tertiary cache memory devices are used between the internal cache and main memory.

DRAM is used for main memory because it offers a good balance between speed and bit cost. Moreover, there are now some semiconductor memory devices that have a large capacity. In recent years, memory chips have been developed with capacities that exceed one gigabyte. DRAM is volatile memory that loses stored data if its power supply is turned off. That makes DRAM unsuitable for the storage of programs and archival information. Also, even when the power supply is turned on, the device has to periodically perform refresh operations in order to retain stored data, so there are limits as to how much device electrical power consumption can be reduced, while yet a further problem is the complexity of the controls run under the controller.

Semiconductor flash memory is high capacity and non-volatile, but requires high current for writing and erasing data, and write and erase times are slow. These drawbacks make flash memory an unsuitable candidate for replacing DRAM in main memory applications. There are other non-volatile memory devices, such as magnetoresistive random access memory (MRAM) and ferroelectric random access memory (FRAM), but, they cannot easily achieve the kind of storage capacities that are possible with DRAM.

Another type of semiconductor memory that is being looked to as a possible substitute for DRAM is phase change random access memory (PRAM), which uses phase change material to store data. In a PRAM device, the storage of data is based on the phase state of phase change material contained in the recording layer. Specifically, there is a big difference between the electrical resistivity of the material in the crystalline state and the electrical resistivity in the amorphous state, and that difference can be utilized to store data.

This phase change is effected by the phase change material being heated when a write current is applied. Data is read by applying a read current to the material and measuring the resistance. The read current is set at a level that is low enough not to cause a phase change. Thus, the phase does not change unless it is heated to a high temperature, so data is retained even when the power supply is switched off.

In order to efficiently heat a phase change material by a write current, it is preferable to form a structure in which heat generated by the write current is not easily diffused. Accordingly, there is known a structure in which the top surface of a recording layer is covered with an upper electrode having low thermal conductivity, thereby reducing heat radiation to a bit line having a large thermal capacity and high thermal conductivity. See "Writing Current Reduction for High-density Phase-change RAM," Y. N. Hwang, S. H. Lee, S. J. Ahn, S. Y. Lee, K. C. Ryoo, H. S. Hong, H. C. Koo, F. Yeung, J. H. Oh, H. J. Kim, W. C. Jeong, J. H. Park, H. Horii, Y. H. Ha, J. H. Yi, G. H. Hoh, G. T. Jeong, H. S. Jeong, and Kinam Kim, 2003 IEEE; and "An Edge Contact Type Cell for Phase Change RAM Featuring Very Low Power Consumption," Y. H. Ha, J. H. Yi, H. Horii, J. H. Park, S. H. Joo, S. O. Park, U-In Chung, and J. T. Moon, 2003 Symposium on VLSI Technology Digest of Technical Papers.

In the structures described in the above papers, however, an interlayer insulation film is arranged between the upper electrode and the bit line. Therefore, in order to connect the upper electrode and the bit line, it is necessary to form a through-hole in the interlayer insulation film and embed a conductive material (upper electrode contact) in the through-hole. The condition for forming the through-hole and the condition for embedding the conductive material increasingly become severe when the non-volatile memory element is further miniaturized. Therefore, when the non-volatile memory element is further miniaturized, it becomes difficult to form the through-hole or to embed the conductive material. Further, since a mask pattern for forming the through-hole in the interlayer insulation film is necessary, this becomes one of the factors that increase manufacturing costs.

Such problems can be solved by laminating the recording layer, the upper electrode, and the bit line without interposing the interlayer insulation film, and pattering this laminate collectively. In this case, however, the entire top surface of the recording layer is covered with the upper electrode. In addition, the entire top surface of the upper electrode is covered with the bit line. As a result, heat radiation to the bit line increases, thereby greatly decreasing the heat efficiency.

SUMMARY OF THE INVENTION

The present invention has been achieved to solve the above problems. It is therefore an object of the present invention to provide a non-volatile memory element that includes a recording layer that contains a phase change material, and that can suppress heat radiation to a bit line while an upper electrode and the bit line are connected without using a through-hole, and also a manufacturing method therefor.

A non-volatile memory element according to one aspect of the present invention comprises:

a lower electrode;

an upper electrode;

a recording layer containing a phase change material arranged between the lower electrode and the upper electrode; and a bit line substantially directly arranged on the upper electrode, wherein the bit line is offset to the recording layer.

According to this aspect of the present invention, since the bit line is offset to a recording layer, it is possible to reduce a contact area between the recording layer and the upper electrode or a contact area between the upper electrode and the bit line even when an interlayer insulation film is not arranged between the upper electrode and the bit line. Therefore, it is possible to suppress heat radiation to the bit line while connecting the upper electrode and the bit line without using the through-hole.

In this case, the bit line is preferably offset to the recording layer so that a lower electrode and the bit line do not overlap. Thus, the distance between a phase change region in the recording layer and the bit line increases, thereby further suppressing the heat radiation to the bit line.

A non-volatile memory element according to another aspect of the present invention comprises:

an interlayer insulation film having a through-hole;

a recording layer containing a phase change material formed in the through-hole;

a lower electrode connected to a bottom surface of the recording layer;

an upper electrode connected to a top surface of the recording layer; and a bit line arranged on the interlayer insulation film and connected to the upper electrode, wherein at least one of the upper electrode and the bit line is formed so that the edge traverses the through-hole.

A manufacturing method of a non-volatile memory element according to one aspect of the present invention comprises:

a first step of forming a lower electrode;

a second step of forming a recording layer containing a phase change material and contacting the lower electrode;

a third step of forming an upper electrode contacting the recording layer;

a fourth step of forming an interlayer insulation film covering side surfaces of the recording layer and the upper electrode;

a fifth step of making flat a top surface of the upper electrode and a top surface of the interlayer insulation film; and a sixth step of forming a bit line so that one portion of a bottom surface contacts the top surface of the upper electrode and a remaining portion of the bottom surface contacts the top surface of the interlayer insulation film.

A manufacturing method of a non-volatile memory element according to another aspect of the present invention comprises:

a first step of forming a lower electrode;

a second step of forming a recording layer containing a phase change material and contacting the lower electrode;

a third step of forming an interlayer insulation film covering a side surface of the recording layer;

a fourth step of making flat a top surface of the recording layer and a top surface of the interlayer insulation film; and a fifth step of forming a laminate consisting of the upper electrode and a bit line so that one portion of a bottom surface contacts the top surface of the recording layer and a remaining portion of the bottom surface contacts the top surface of the interlayer insulation film.

A manufacturing method of a non-volatile memory element according to still another aspect of the present invention comprises:

a first step of forming a lower electrode;

a second step of forming a recording layer containing a phase change material and contacting the lower electrode;

a third step of forming an upper electrode contacting the recording layer;

a fourth step of forming a sidewall insulation layer covering side surfaces of the recording layer and the upper electrode; and a fifth step of forming a bit line so that one portion of a bottom surface contacts the upper electrode and a remaining portion of the bottom surface contacts the sidewall insulation layer.

As described above, according to the present invention, it is possible to reduce a contact area between the recording layer and the upper electrode or a contact area between the upper electrode and the bit line without providing the interlayer insulation film between the upper electrode and the bit line. Thus, it is possible to suppress heat radiation to the bit line while connecting the upper electrode and the bit line without using a through-hole.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
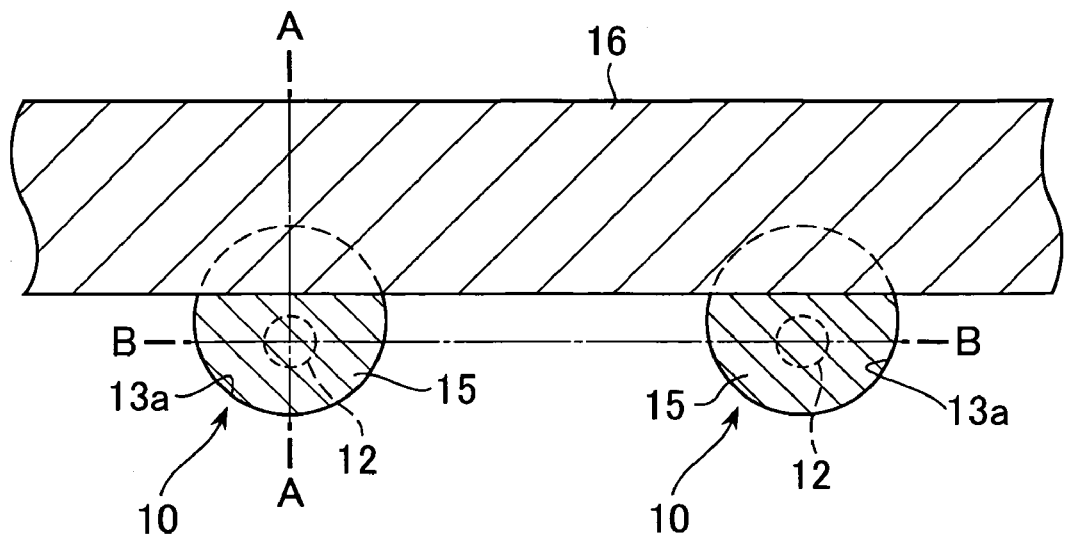
FIG. 1 is a schematic plan view of a structure of a non-volatile memory element according to a first preferred embodiment of the present invention.
Figure 2:
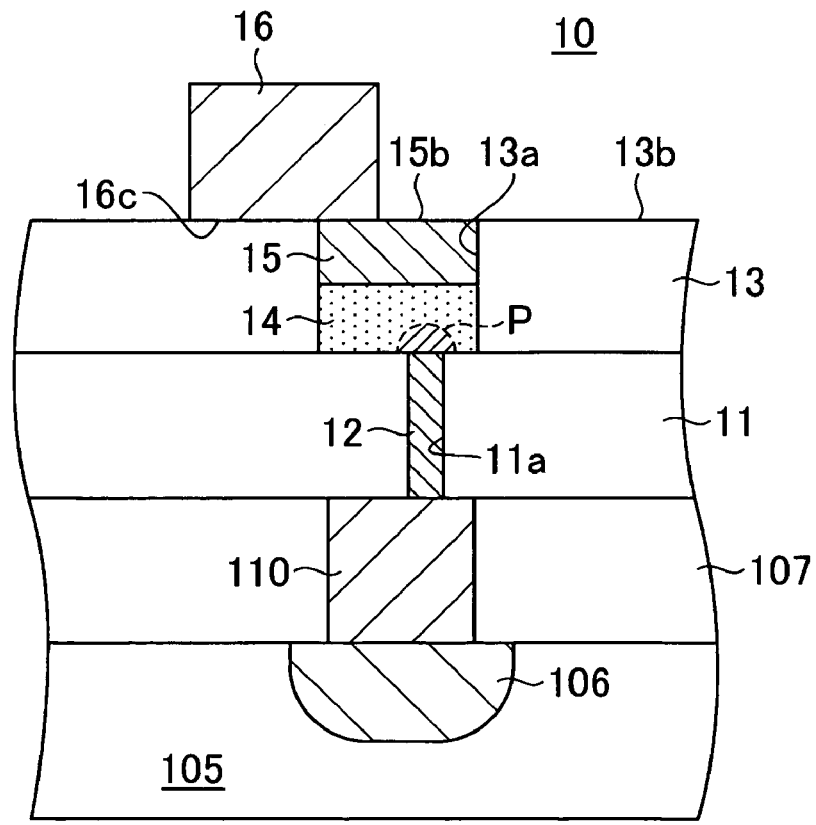
FIG. 2 is a schematic cross section taken along a line A-A shown in FIG. 1.
Figure 3:
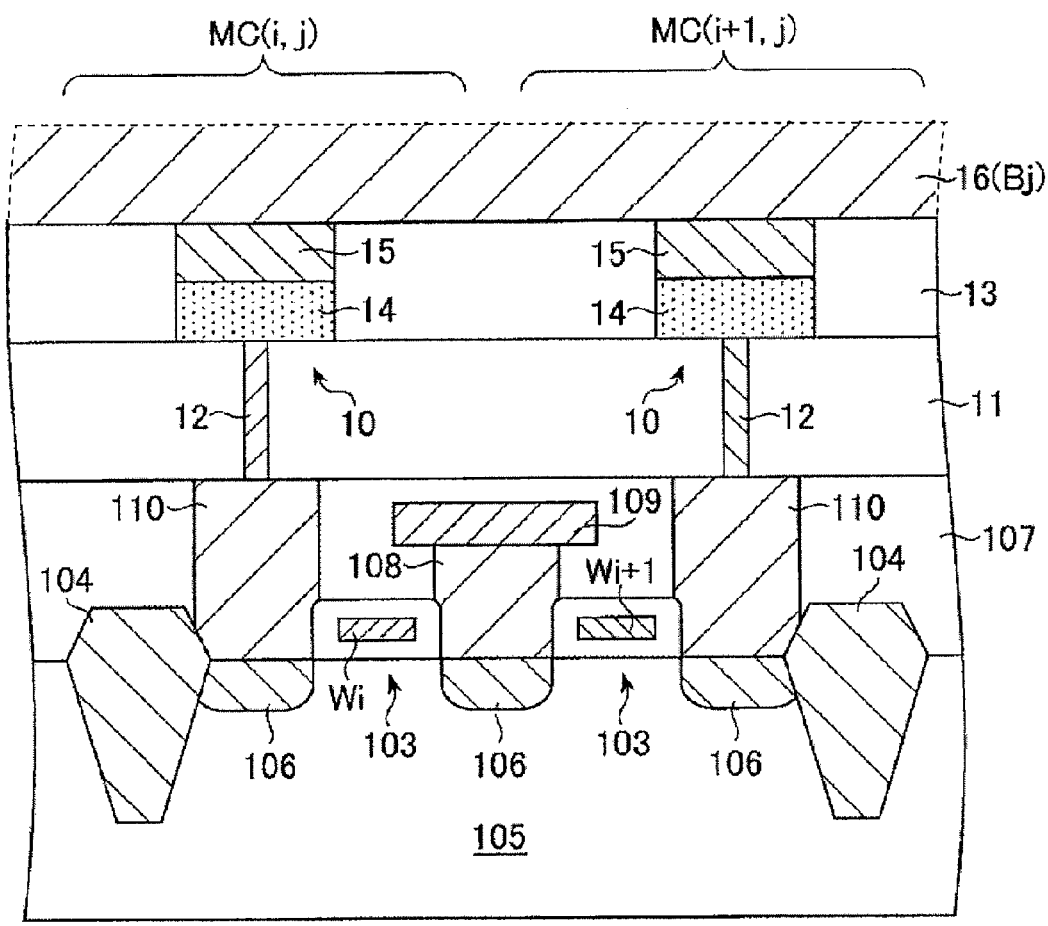
FIG. 3 is a schematic cross section taken along a line B-B shown in FIG. 1.

FIG. 1 is a schematic plan view of a structure of a non-volatile memory element 10 according to a first preferred embodiment of the present invention. FIG. 2 is a schematic cross section taken along a line A-A shown in FIG. 1. FIG. 3 is a schematic cross section taken along a line B-B shown in FIG. 1. FIG. 3 shows a structure of a memory cell that uses the non-volatile memory element 10 according to this embodiment.

As shown in FIG. 1 and FIG. 2, the non-volatile memory element 10 according to this embodiment includes an interlayer insulation film 11 having a through-hole 11a, a lower electrode 12 arranged inside the through-hole 11a, an interlayer insulation film 13 having a through-hole 13a, a recording layer 14 and an upper electrode 15 arranged inside the through-hole 13a, and a bit line 16 arranged to be offset to a recording layer 14.

As materials for the interlayer insulation films 11 and 13, a silicon oxide layer, a silicon nitride layer, or the like can be used.

The lower electrode 12 is used as a heater plug. That is, the lower electrode 12 serves as one portion of a heating element at the time of data writing. For this reason, examples of materials preferably used for the lower electrode 12 include a material having relatively high electric resistance such as metal silicide, metal nitride, and nitride composed of metal silicide, for example. Examples are not restrictive, but may include high-melting metals such as W, TiN, TaN, WN, and TiAlN, and nitride composed thereof, and nitride composed of high-melting metal silicide such as TiSiN and WSiN. Materials such as TiCN are further preferably used.

As shown in FIG. 1, the lower electrode 12 is arranged at a position corresponding to the through-hole 13a arranged in the interlayer insulation film 13. The recording layer 14 and the upper electrode 15 are arranged in this order inside the through-hole 13a. Accordingly, the bottom surface of the recording layer 14 contacts the lower electrode 12 and the top surface of the recording layer 14 contacts the upper electrode 15.

The recording layer 14 is composed of a phase change material. The phase change material constituting the recording layer 14 is not particularly limited insofar as the material assumes two or more phase states and has an electrical resistance that changes according to the phase state. A so-called halcogenide material is preferably selected. A chalcogenide material is defined as an alloy that contains at least one or more elements selected from the group consisting of germanium (Ge), antimony (Sb), tellurium (Te), indium (In), selenium (Se), and the like. Examples include GaSb, InSb, InSe, $Sb_2Te_3$, GeTe, and other binary-based elements; $Ge_2Sb_2Te_5$, InSbTe, GaSeTe, $SnSb_2Te_4$, InSbGe, and other tertiary-based elements; and AgInSbTe, (GeSn)SbTe, GeSb(SeTe), $Te_{81}Ge_{15}Sb_2S_2$, and other quaternary-based elements.

A phase change material that includes a chalcogenide material may assume any phase state including an amorphous phase (non-crystalline phase) and a crystalline phase, with a relatively high-resistance state occurring in the amorphous phase, and a relatively low-resistance state occurring in the crystalline phase.

Figure 4:
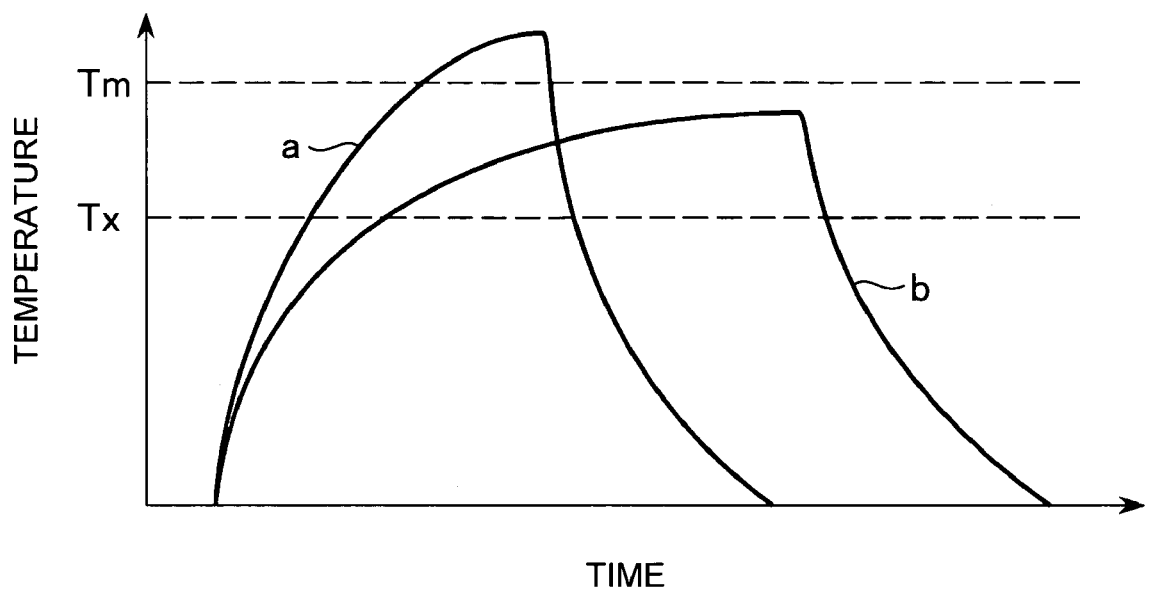
FIG. 4 is a graph showing the method for controlling the phase state of the phase change material that includes a chalcogenide material.

FIG. 4 is a graph showing the method for controlling the phase state of the phase change material that includes a chalcogenide material.

In order to place the phase change material that includes a chalcogenide material in the amorphous state, the material is cooled after being heated to a temperature equal to or higher than the melting point Tm, as indicated by the curve a in FIG. 4. In order to place the phase change material that includes a chalcogenide material in the crystalline state, the material is cooled after being heated to a temperature at or above the crystallization temperature Tx and lower than the melting point Tm, as indicated by the curve b in FIG. 4. Heating may be performed by applying an electric current. The temperature during heating may be controlled according to the amount of applied current, i.e., the current application time or the amount of current per unit time.

When a write current flows to the recording layer 14, the area near where the recording layer 14 and the lower electrode 12 are in contact with each other becomes a heat generation region P. In other words, the phase state of the chalcogenide material in the vicinity of the heat generation region P can be changed by the flow of a write current to the recording layer 14. The electrical resistance between the bit line 16 and the lower electrode 12 is thereby changed.

The recording layer 14 is arranged in the bottom portion of the through-hole 13a, as shown in FIG. 2. On the other hand, the upper electrode 15 is arranged in the upper portion of the through-hole 13a. Both the recording layer 14 and the upper electrode 15 are preferably set to approximately 30 nm to 100 nm in thickness, for example, approximately 50 nm. The upper electrode 15 forms a pair with the lower electrode 12. As materials for the upper electrode 15, a material having relatively low thermal conductivity is preferably used so that heat generated by current flow does not easily diffuse. More specifically, similarly to the lower electrode 12, a material such as TiAlN, TiSiN, and TiCN can be preferably used.

As shown in FIG. 2, a top surface 15b of the upper electrode 15 and a top surface 13b of the interlayer insulation film 13 form substantially a same plane. That is, the top surface 15b of the upper electrode 15 and the top surface 13b of the interlayer insulation film 13 form substantially a flat surface.

The bit line 16 is formed so as to cover one portion of a boundary line between the upper electrode 15 and the interlayer insulation film 13. In other words, the bit line 16 is formed so that an edge thereof traverses the through-hole 13a. As a result, one portion of a bottom surface 16c of the bit line 16 contacts one portion of the top surface 15b of the upper electrode 15, and the remaining portion thereof contacts the top surface 13b of the interlayer insulation film 13. The remaining portion of the top surface 15b of the upper electrode 15 does not contact the bit line 16.

Examples of materials used for the bit line 16 may be selected from metallic materials having low electric resistance. Materials preferably used therefor may include aluminum (Al), titanium (Ti), tungsten (W), an alloy thereof, nitride thereof, and silicide. More specifically, examples include W, WN, and TiN. The metal material having low electric resistance generally has high thermal conductivity. Furthermore, since the bit line 16 has a large thermal capacity, when the bit line 16 contacts the recording layer 14 near a phase change region P, heat tends to diffuse to the bit line 16 side, so that heat generation efficiency deteriorates. In the non-volatile memory element 10 according to this embodiment, however, the bit line 16 is arranged to be offset to the recording layer 14 as shown in FIG. 1 and FIG. 2, so that a contact area between the upper electrode 15 and the bit line 16 is reduced while a distance between the phase change region P and the bit line 16 increases.

The non-volatile memory element 10 having such a configuration can be formed on a semiconductor substrate as shown in FIG. 2 and FIG. 3. By arranging the non-volatile memory element 10 in a matrix shape, an electrically rewritable non-volatile semiconductor memory storage device can be configured.

Figure 5:
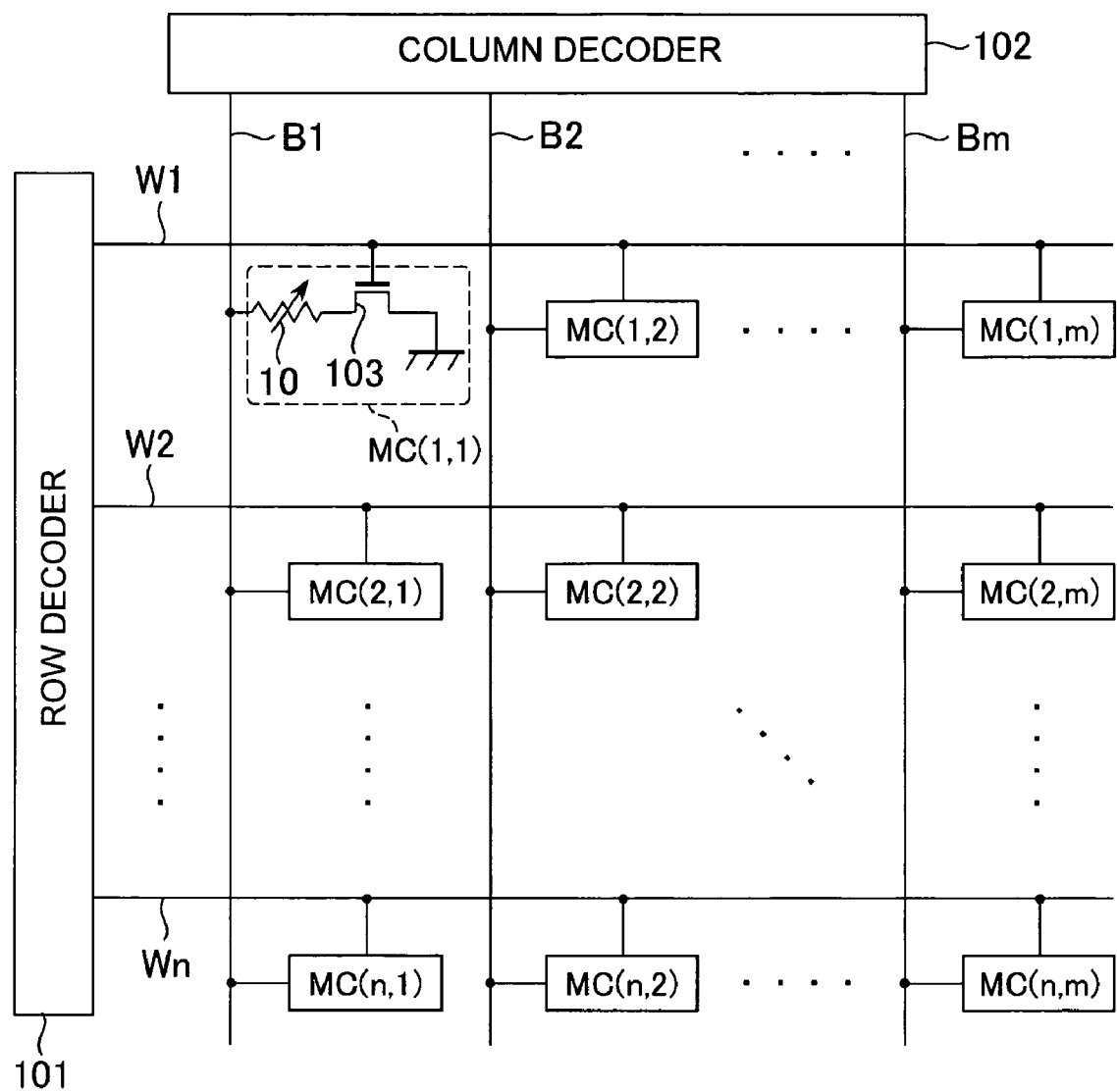
FIG. 5 is a circuit diagram of a non-volatile semiconductor storage device having a matrix structure with n rows and m columns.

FIG. 5 is a circuit diagram of a non-volatile semiconductor storage device having a matrix structure with n rows and m columns.

The non-volatile semiconductor storage device shown in FIG. 5 is provided with n word lines W1-Wn, m bit lines B1-Bm, and memory cells MC(1, 1)-MC(n, m) disposed at the intersections of the word lines and the bit lines. The word lines W1-Wn are connected to a row decoder 101, and the bit lines B1-Bm are connected to a column decoder 102. The memory cells MC are composed of a non-volatile memory element 10 and a transistor 103 connected in series between a ground and the corresponding bit line. The control terminal of the transistor 103 is connected to the corresponding word line.

The non-volatile memory element 10 has the structure described with reference to FIG. 1. The lower electrode 12 of the non-volatile memory element 10 is therefore connected to the corresponding transistor 103.

FIG. 3 shows two memory cells MC (i, j), MC (i+1, j) that share the same corresponding bit line Bj.

As shown in FIG. 3, the gates of the transistors 103 are connected to word lines Wi, Wi+1. Three diffusion regions 106 are formed in a single active region 105 partitioned by element separation regions 104, whereby two transistors 103 are formed in a single active region 105. These two transistors 103 share the same source, which is connected to ground wiring 109 via a contact plug 108 provided to the interlayer insulation film 107. The drains of the transistors 103 are connected to the lower electrode 12 of the corresponding non-volatile memory element 10 via contact plugs 110. The two non-volatile memory elements 10 share the same bit line Bj.

The non-volatile semiconductor storage device having this type of configuration can perform writing and reading of data by activating any of the word lines W1-Wn through the use of the row decoder 101, and allowing a current to flow to at least one of the bit lines B1-Bm in this state. In other words, in a memory cell in which the corresponding word line is activated, the transistor 103 is ON, and the corresponding -bit line is then connected to the ground via the non-volatile memory element 10. Accordingly, by allowing a write current to flow to the bit line selected by a prescribed column decoder 102 in this state, a phase change can be effected in the recording layer 14 included in the non-volatile memory element 10.

Specifically, by allowing a prescribed amount of current to flow, the phase change material constituting the recording layer 14 is placed in the amorphous phase by heating the phase change material to a temperature equal to or higher than the melting point Tm shown in FIG. 4, and then rapidly interrupting the current to cause rapid cooling. By allowing an amount of current to flow that is smaller than the above-mentioned prescribed amount, the phase change material constituting the recording layer 14 is placed in the crystalline phase by heating the phase change material to a temperature equal to or higher than the crystallization temperature Tx and less than the melting point Tm shown in FIG. 4, and then gradually reducing the current to cause gradual cooling in order to facilitate crystal growth.

Also in the case of reading data, any one of the word lines W1-Wn is activated by the row decoder 101, and while in this state, a read current is allowed to flow to at least one of the bit lines B1-Bm. Since the resistance value is high for a memory cell in which the recording layer 14 is in the amorphous phase, and the resistance value is low for a memory cell in which the recording layer 14 is in the crystalline phase, the phase state of the recording layer 14 can be ascertained by detecting these values using a sense amplifier (not shown).

The phase state of the recording layer 14 can be correlated with a stored logical value. For example, defining an amorphous phase state as "0" and a crystalline phase state as "1" makes it possible for a single memory cell to retain 1-bit data. The crystallization ratio can also be controlled in multi-stage or linear fashion by adjusting the time for which the recording layer 14 is maintained at the temperature equal to or higher than the crystallization temperature Tx and less than the melting point Tm when a change occurs from the amorphous phase to the crystalline phase. Performing multi-stage control of the mixture ratio of amorphous states and crystalline states by this type of method makes it possible for 2-bit or higher order data to be stored in a single memory cell. Furthermore, performing linear control of the mixture ratio of amorphous states and crystalline states makes it possible to store analog values.

A manufacturing method of the non-volatile memory element 10 according to this embodiment will be described next.

Figure 6:
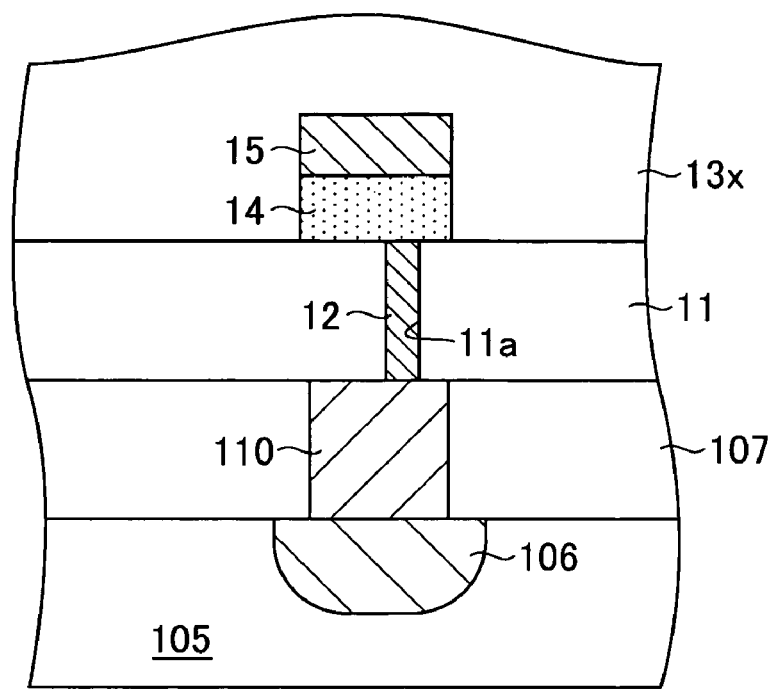
FIG. 6 is a process diagram showing a process of forming an interlayer insulation film.
Figure 7:
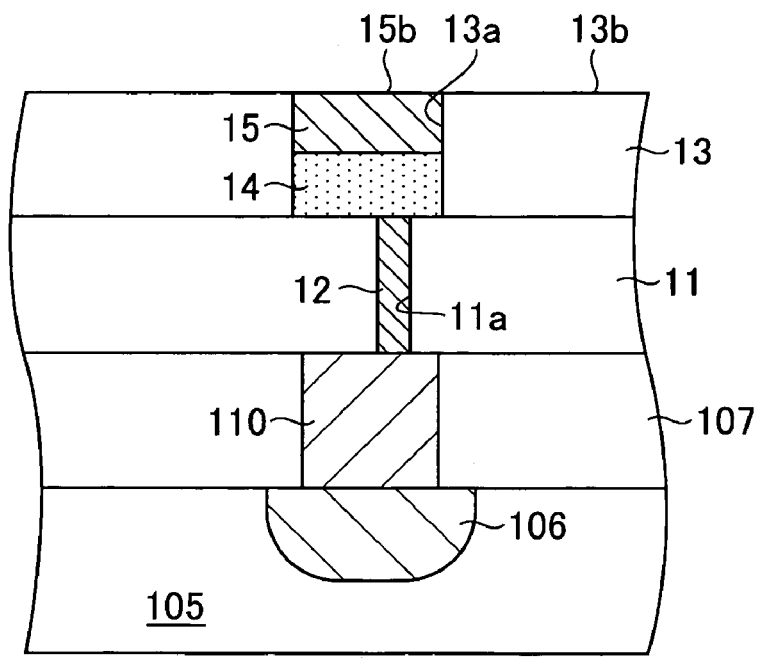
FIG. 7 is a process diagram showing a process of polishing the interlayer insulation film.
Figure 8:
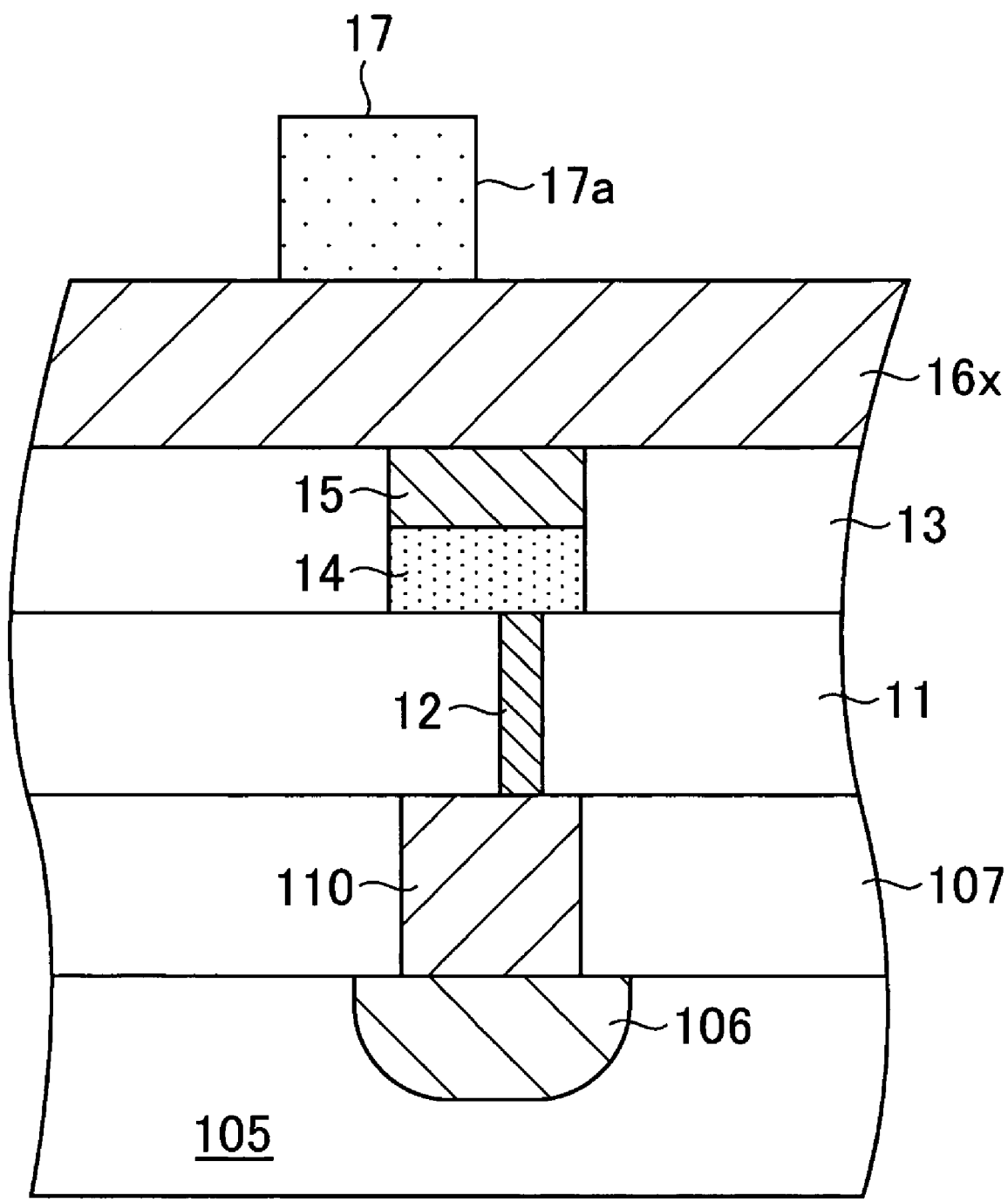
FIG. 8 is a process diagram showing a process of forming a conductive layer and a photoresist.

FIG. 6 to FIG. 8 are schematic plan views sequentially showing manufacturing steps of the non-volatile memory element 10, and each corresponds to the cross section taken along the line A-A shown in FIG. 1.

Firstly, as shown in FIG. 6, a through-hole 11a is arranged in the interlayer insulation film 11, and the lower electrode 12 is formed inside thereof. Thereafter, the recording layer 14 and the upper electrode 15 are formed in this order. The lower electrode 12 can be formed by forming the through-hole 11a in the interlayer insulation film 11, filling the internal portion of the through-hole 11a with the lower electrode 12 by using a film formation method having good step coverage, and removing an unnecessary portion of the lower electrode 12 by CMP. The film formation method having good step coverage includes CVD.

The recording layer 14 and the upper electrode 15 can be collectively patterned using a photoresist (not shown) as a mask after forming layers, which are the materials for the recording layer 14 and the upper electrode 15, on the entire surface. In this case, since the top surface of the recording layer 14 is always kept to be covered with the upper electrode 15, it is possible to avoid damage on the recording layer 14 upon patterning or ashing of the photoresist (not shown). Film formation methods of the recording layer 14 and the upper electrode 15, although not limited, include a sputtering method and CVD. Thereafter, an interlayer insulation film 13x is formed on the entire surface, thereby completely covering the top surface and side surfaces of the recording layer 14 and the upper electrode 15. It is preferable to use CVD as a method of forming the interlayer insulation film 13x.

Next, as shown in FIG. 7, the interlayer insulation film 13x is polished by CMP to expose the top surface 15b of the upper electrode 15. As a result, the top surface 13b of the interlayer insulation film 13 and the top surface 15b of the upper electrode 15 become flat, thereby forming substantially a same plane. The interlayer insulation film 13x is polished to be flat to form an interlayer insulation film 13.

Next, as shown in FIG. 8, a conductive layer 16x that serves as a material for the bit line is directly formed on the interlayer insulation film 13 and the upper electrode 15. That is, the conductive layer 16x is directly formed without interposing another interlayer insulation film or the like on the upper electrode 15. Consequently, the upper electrode 15 and the conductive layer 16x become a direct contact state. A sputtering method, although not particularly limited, is preferably used as the film formation method of the conductive layer 16x.

Thereafter, as shown in FIG. 8, a photoresist 17 is formed at a position to be offset to the recording layer 14. Herein, "the position to be offset to the recording layer 14" means a position where the entire top surface of the recording layer 14 is not covered with the photoresist 17. In this embodiment, an edge 17a of the photoresist 17 traverses the recording layer 14. Thus, only one portion of the recording layer 14 overlaps the photoresist 17. It is particularly preferable to form the photoresist 17 at a position not overlapping the lower electrode 12.

After the photoresist 17 is formed, the conductive layer 16x is patterned by using the photoresist 17 as a mask, and a portion not covered with the photoresist 17 is removed. In this case, since a formation surface of the conductive layer 16x, that is, the top surface 13b of the interlayer insulation film 13 and the top surface 15b of the upper electrode 15, forms a flat surface, a patterning can be performed with high accuracy. Thereafter, the structure shown in FIG. 2 can be obtained by removing the photoresist 17 by an ashing process.

According to this method, the patterned bit line 16 is formed at a position to be offset to the recording layer 14. Therefore, a contact area between the upper electrode 15 and the bit line 16 is reduced, and the distance between the phase change region P and the bit line 16 can be increased. Furthermore, since the interlayer insulation film is not provided between the upper electrode 15 and the bit line 16, there is no need to form an upper electrode contact or the like, which makes it possible to secure a sufficient manufacturing margin even when the non-volatile memory element is miniaturized.

Figure 9:
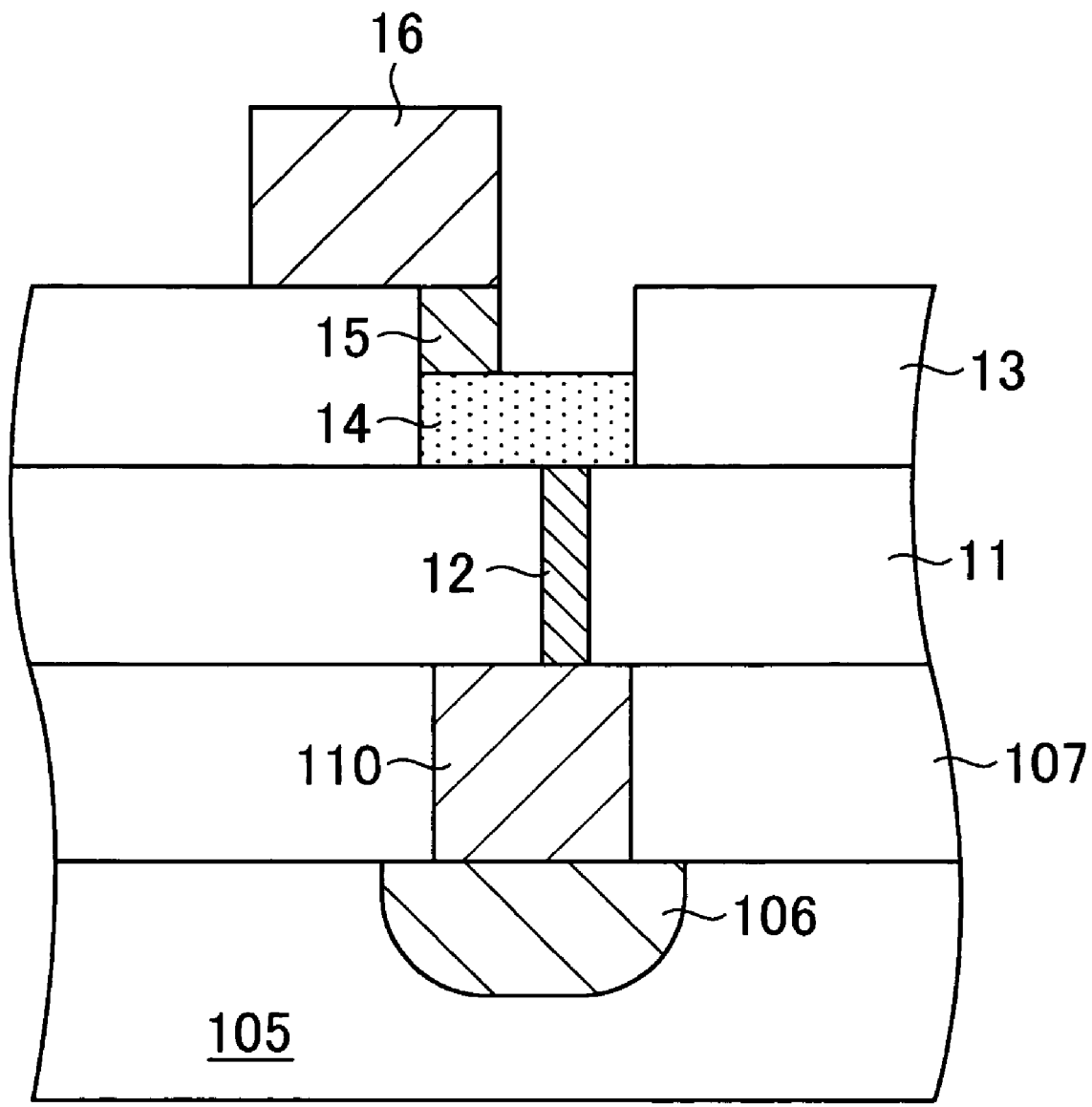
FIG. 9 is a schematic plan view of a structure of a non-volatile memory element according to a modified example of the first embodiment.

It is noted that in the upper electrode 15, any portion not covered with the bit line 16 can be removed by patterning the bit line 16 using the photoresist 17 as a mask, followed by performing over-etching in which the photoresist 17 is continuously used. When such over-etching is performed, the upper electrode 15 remains only in a region where the recording layer 14 and the bit line 16 overlap, as shown in FIG. 9. With this configuration, it becomes possible to reduce not only the contact area between the upper electrode 15 and the bit line 16 but also a contact area between the recording layer 14 and the upper electrode 15, thereby further reducing the heat radiation to the bit line 16 side.

Figure 10:
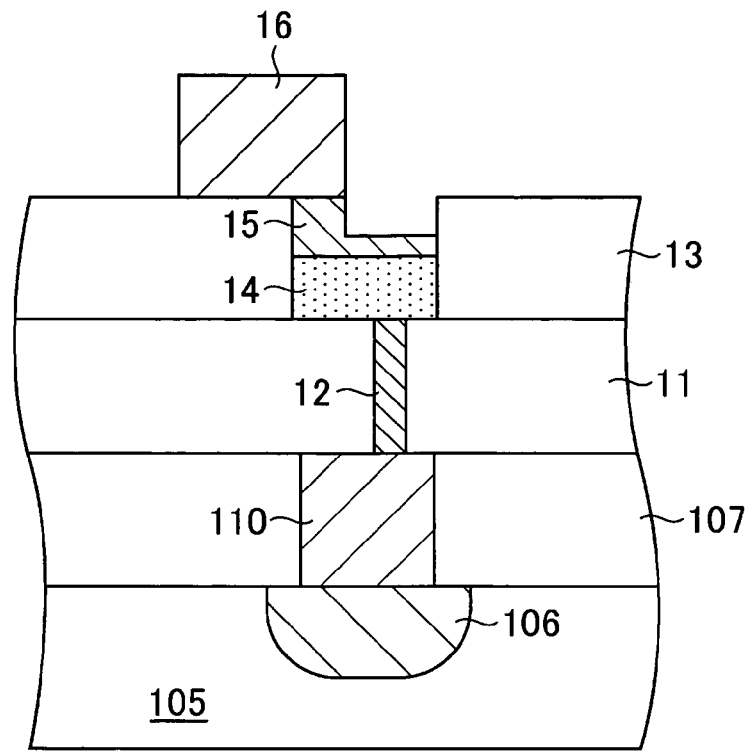
FIG. 10 is a schematic plan view of a structure of a non-volatile memory element according to another modified example of the first embodiment.

The removal of the upper electrode 15 by the over-etching needs not be performed until the recording layer 14 is completely exposed, and can be performed only to the extent that one portion of a portion not covered with the bit line 16 is removed, and the film thickness in the concerned portion is thereby reduced as shown in FIG. 10. In this case, although the contact area between the recording layer 14 and the upper electrode 15 is not reduced, the thermal capacity of the upper electrode 15 is reduced, and therefore, the heat radiation to the bit line 16 side can be reduced. The recording layer 14 is not exposed to an etching environment, and thus, it becomes also possible to reduce the possibility that a phase change material changes in quality due to the damage imposed on the recording layer 14.

As described above, in the non-volatile memory element 10 of this embodiment, the top surface 13b of the interlayer insulation film 13 and the top surface 15b of the upper electrode 15 form a flat surface, and the bit line 16 is formed so as to cover one portion of a boundary line between the upper electrode 15 and the interlayer insulation film 13, thereby reducing the contact area between the upper electrode 15 and the bit line 16 without providing an interlayer insulation film between the upper electrode 15 and the bit line 16. Thus, it is possible to suppress heat radiation to the bit line 16 while connecting the upper electrode 15 and the bit line 16 without using a through-hole.

In the above embodiment, after the recording layer 14 and the upper electrode 15 are patterned, the interlayer insulation film 13 is formed, as shown in FIG. 6 and FIG. 7. On the contrary, the recording layer 14 and the upper electrode 15 can be formed inside the through-hole 13a after the through-hole 13a is formed in the interlayer insulation film 13.

Figure 11:
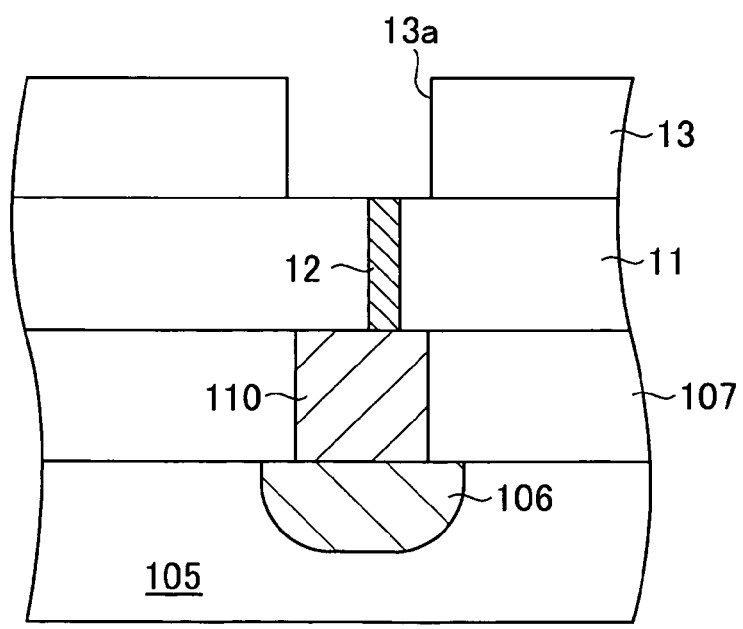
FIG. 11 is a process diagram showing a process of forming a through-hole.

That is, as shown in FIG. 11, before the recording layer 14 and the upper electrode 15 are formed, the interlayer insulation film 13 is formed, and the through-hole 13a is further formed in the interlayer insulation film 13. The through-hole 13a needs be formed at a position where the lower electrode 12 is exposed. In this case, as materials for the interlayer insulation film 11 and those for the interlayer insulation film 13, when materials of which etching rates vary with each other are selected, the interlayer insulation film 11 is not easily over-etched at the time of the formation of the through-hole 13a. For example, when a silicon nitride layer is used as a material for the interlayer insulation film 11, a silicon oxide layer is preferably used as a material for the interlayer insulation film 13.

Figure 12:
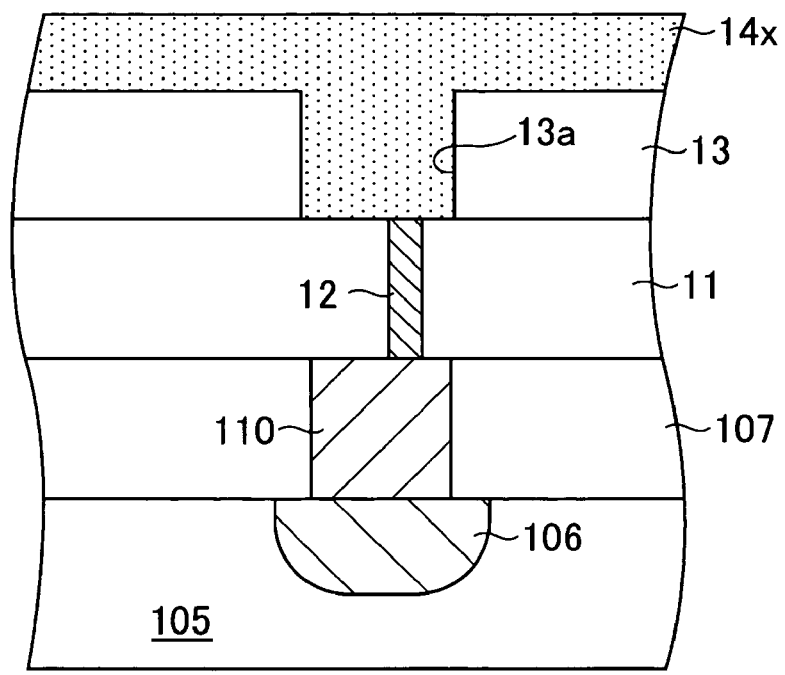
FIG. 12 is a process diagram showing a process of forming a phase change material layer.

Next, as shown in FIG. 12, a phase change material layer 14x, which serves as a material for the recording layer 14, is formed on the interlayer insulation film 13. The film thickness of the phase change material layer 14x at the time of the film formation is set to be sufficiently thick so that the through-hole 13a is almost completely buried.

Figure 13:
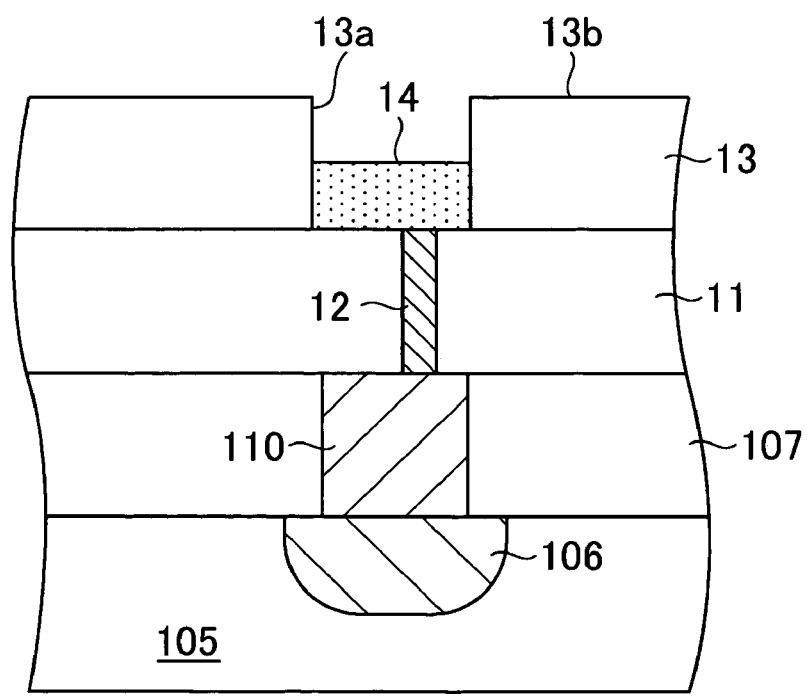
FIG. 13 is a process diagram showing a process of etching back the phase change material layer.

Next, as shown in FIG. 13, the phase change material layer 14x is etched back until the top surface 13b of the interlayer insulation film 13 is exposed. Thus, the phase change material layer 14x remains only in the bottom portion of the through-hole 13a. The remaining portion is the recording layer 14.

Figure 14:
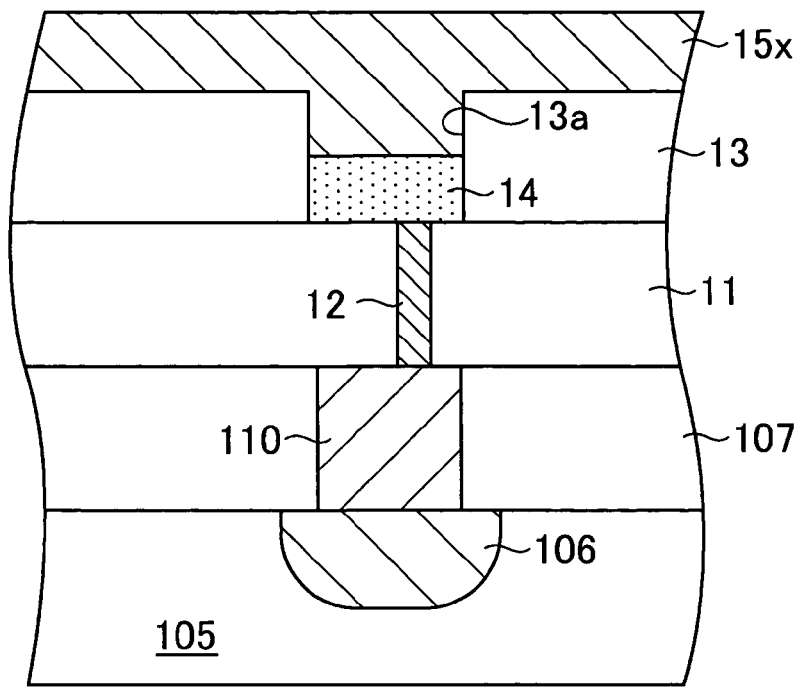
FIG. 14 is a process diagram showing a process of forming a conductive layer.

Subsequently, as shown in FIG. 14, a conductive layer 15x, which serves as a material for the upper electrode 15, is formed on the interlayer insulation film 13. The film thickness of the conductive layer 15x at the time of the film formation is also set to be sufficiently thick so that the through-hole 13a is almost completely buried. This is followed by polishing of the conductive layer 15x by the etching back or CMP until the top surface 13b of the interlayer insulation film 13 is exposed. As a result, the structure shown in FIG. 7 can be obtained.

In the embodiment, although the recording layer 14 and the upper electrode 15 are independently formed for each non-volatile memory element 10, as shown in FIG. 1 and FIG. 3, a plurality of recording layers 14 and upper electrodes 15 in which the bit line 16 is commonly used, can be formed in a seamless state.

Figure 15:
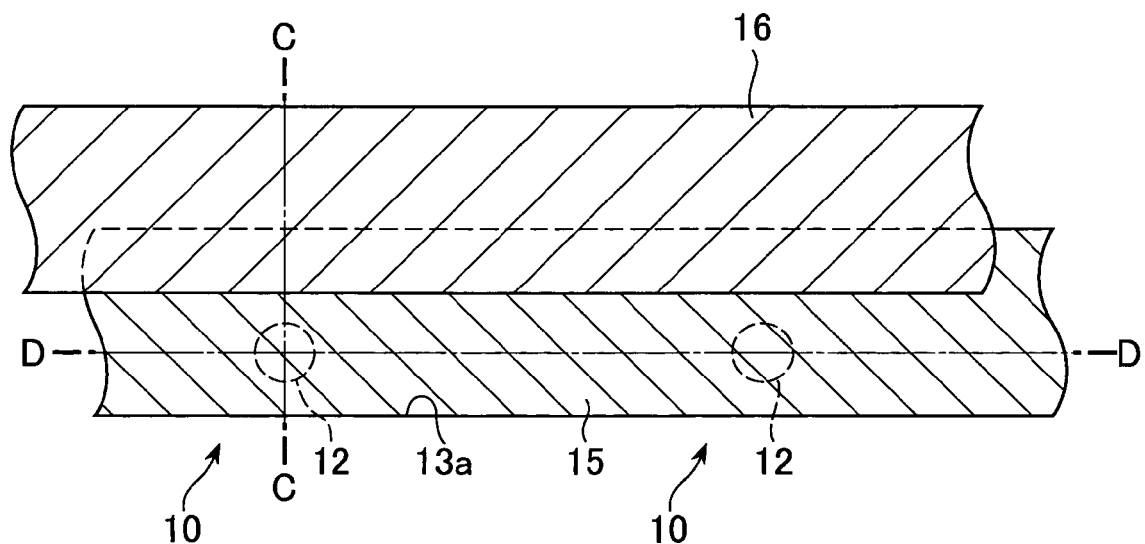
FIG. 15 is a schematic plan view of the structure of the non-volatile memory element as an example in which the recording layer and the upper electrode are formed in a seamless state.
Figure 16:
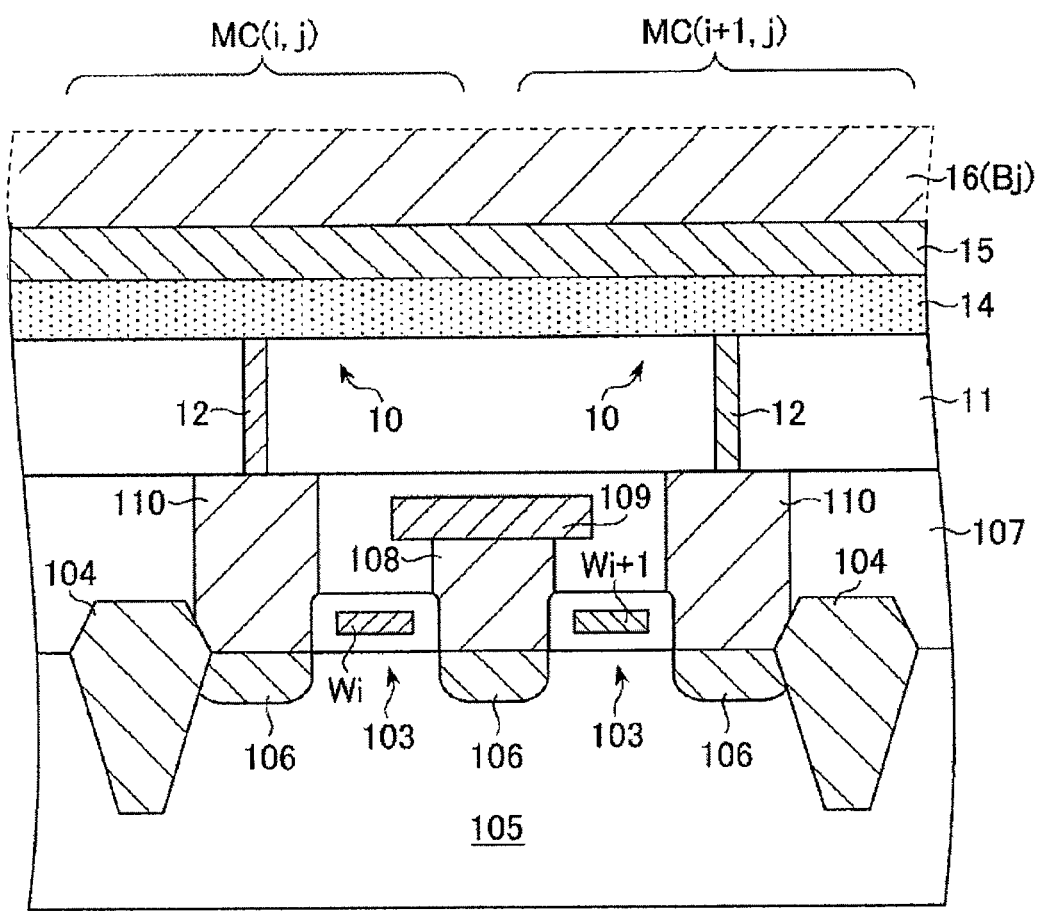
FIG. 16 is a schematic cross section taken along a line D-D shown in FIG. 15.

FIG. 15 is a schematic plan view of the structure of the non-volatile memory element 10 as an example in which the recording layer 14 and the upper electrode 15 are formed in a seamless state. FIG. 16 is a schematic cross section taken along a line D-D shown in FIG. 15. The cross section taken along a line C-C shown in FIG. 15 is as shown in FIG. 2. When a plurality of recording layers 14 and upper electrodes 15 in which the bit line 16 is commonly used are formed in a seamless state, as shown in FIG. 15 and FIG. 16, the above-described effect can be obtained by forming the bit line 16 to be offset to the recording layer 14.

A non-volatile memory element 20 according to a second preferred embodiment of the present invention will be described next.

Figure 17:
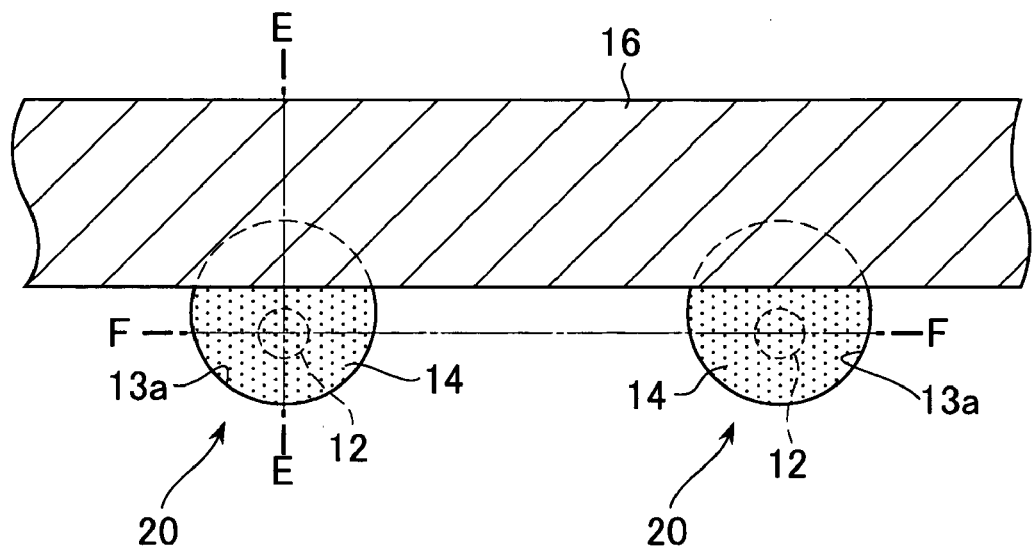
FIG. 17 is a schematic plan view of a structure of the non-volatile memory element according to a second embodiment of the present invention.
Figure 18:
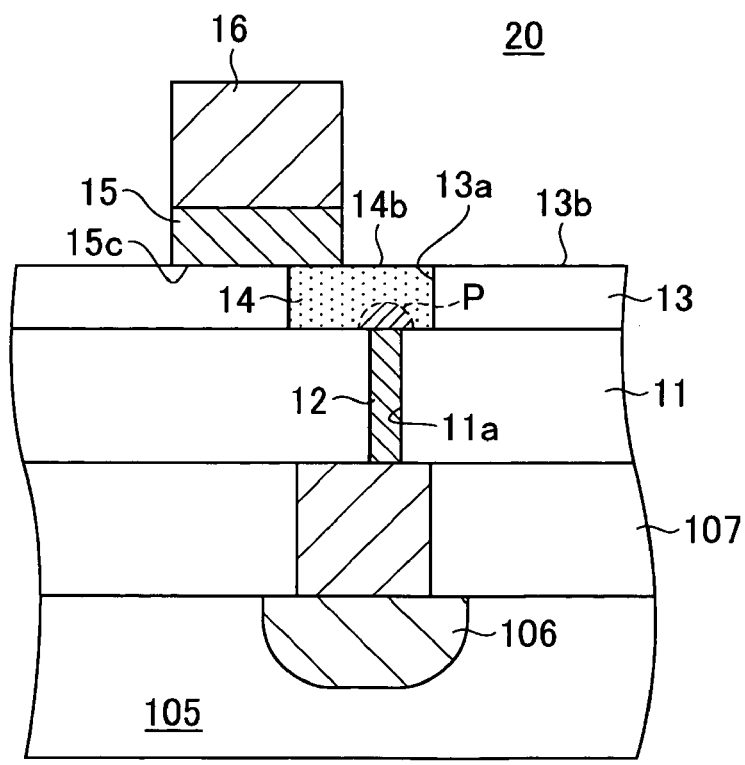
FIG. 18 is a schematic cross section taken along a line E-E shown in FIG. 17.
Figure 19:
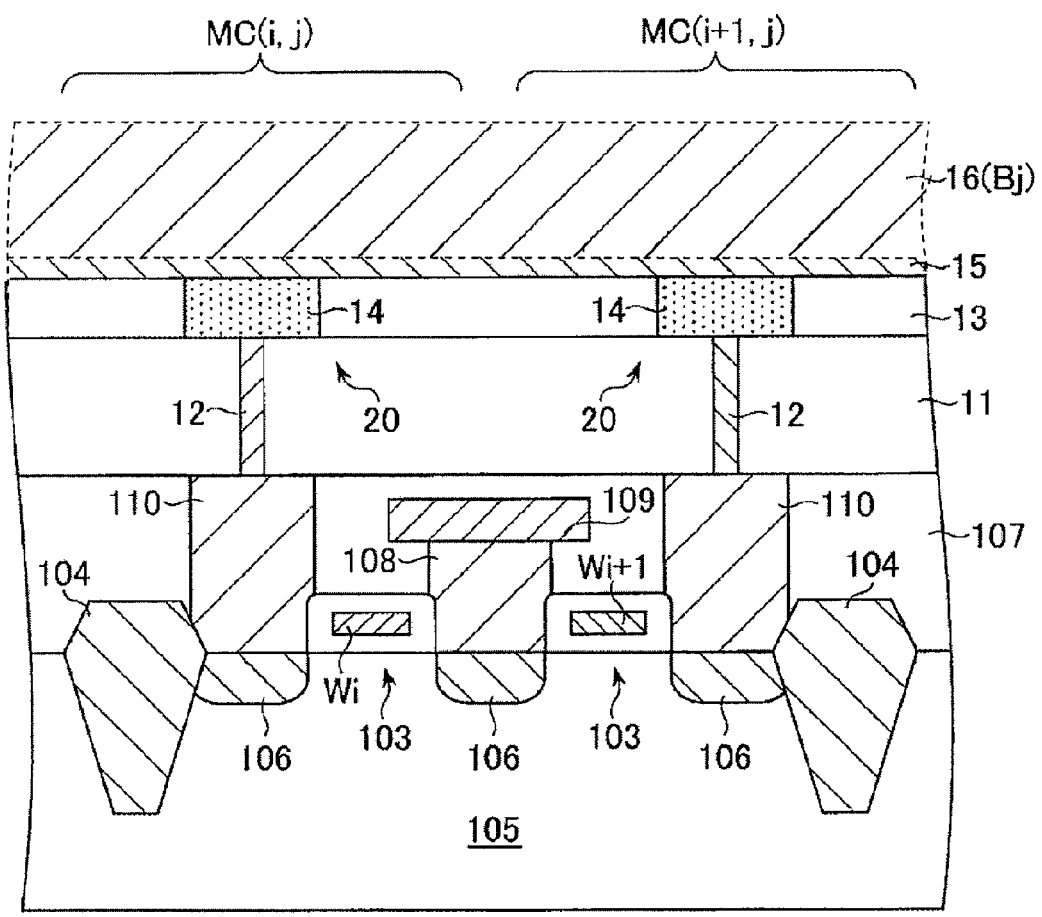
FIG. 19 is a schematic cross section taken along a line F-F shown in FIG. 17.

FIG. 17 is a schematic plan view of a structure of the non-volatile memory element 20 according to the second embodiment of the present invention. FIG. 18 is a schematic cross section taken along a line E-E shown in FIG. 17. FIG. 19 is a schematic cross section taken along a line F-F shown in FIG. 17. FIG. 19 shows a structure of a memory cell that uses the non-volatile memory element 20 of this embodiment.

The non-volatile memory element 20 according to this embodiment is different from the non-volatile memory element 10 according to the first embodiment in that the inner portion of the through-hole 13a is formed with the recording layer 14 alone, and the upper electrode 15 is formed on the interlayer insulation film 13. The remaining respects of the non-volatile memory element 20 are the same as those of the non-volatile memory element 10 according to the first embodiment. Thus, like reference numerals denote like parts, and redundant explanations thereof will be omitted.

In this embodiment, a top surface 14b of the recording layer 14 and the top surface 13b of the interlayer insulation film 13 form substantially a same plane, as shown in FIG. 18. That is, the top surface 14b of the recording layer 14 and the top surface 13b of the interlayer insulation film 13 configure substantially a flat surface.

The upper electrode 15 and the bit line 16 are laminated, and the laminate is formed so as to cover one portion of a boundary line between the recording layer 14 and the interlayer insulation film 13. That is, the upper electrode 15 and the bit line 16 are formed so that edges thereof traverse the through-hole 13a. Thus, one portion of a bottom surface 15c of the upper electrode 15 contacts one portion of the top surface 14b of the recording layer 14, and the remaining portion contacts the top surface 13b of the interlayer insulation film 13. The remaining portion of the top surface 14b of the recording layer 14 does not contact the upper electrode 15. Thus, in this embodiment, the upper electrode 15 and the bit line 16 are arranged to be offset to the recording layer 14, so that a contact area between the recording layer 14 and the upper electrode 15 is reduced, and the distance between the phase change region P and the bit line 16 can be increased.

A manufacturing method of the non-volatile memory element 20 according to this embodiment will be described next.

Figure 20:
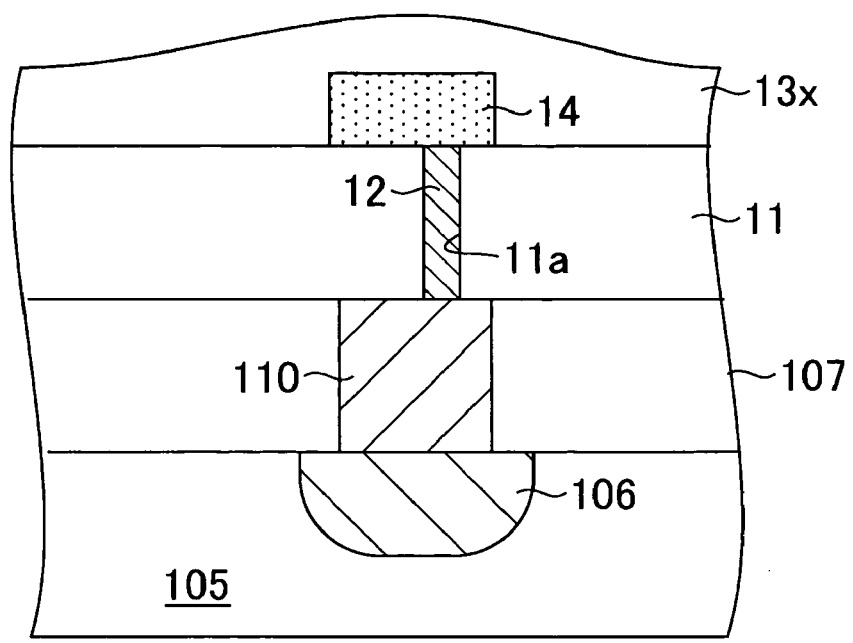
FIG. 20 is a process diagram showing a process of forming an interlayer insulation film.
Figure 21:
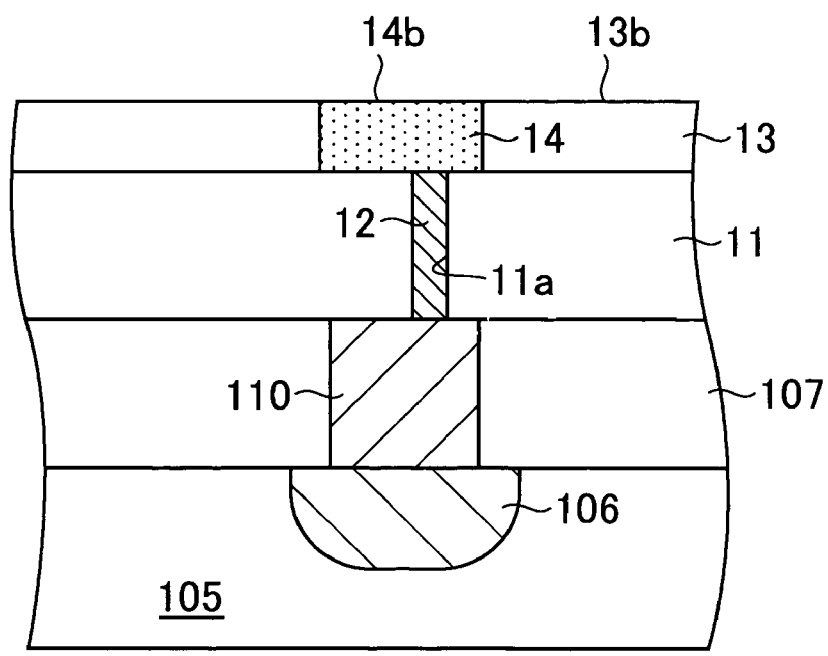
FIG. 21 is a process diagram showing a process of polishing the interlayer insulation film.
Figure 22:
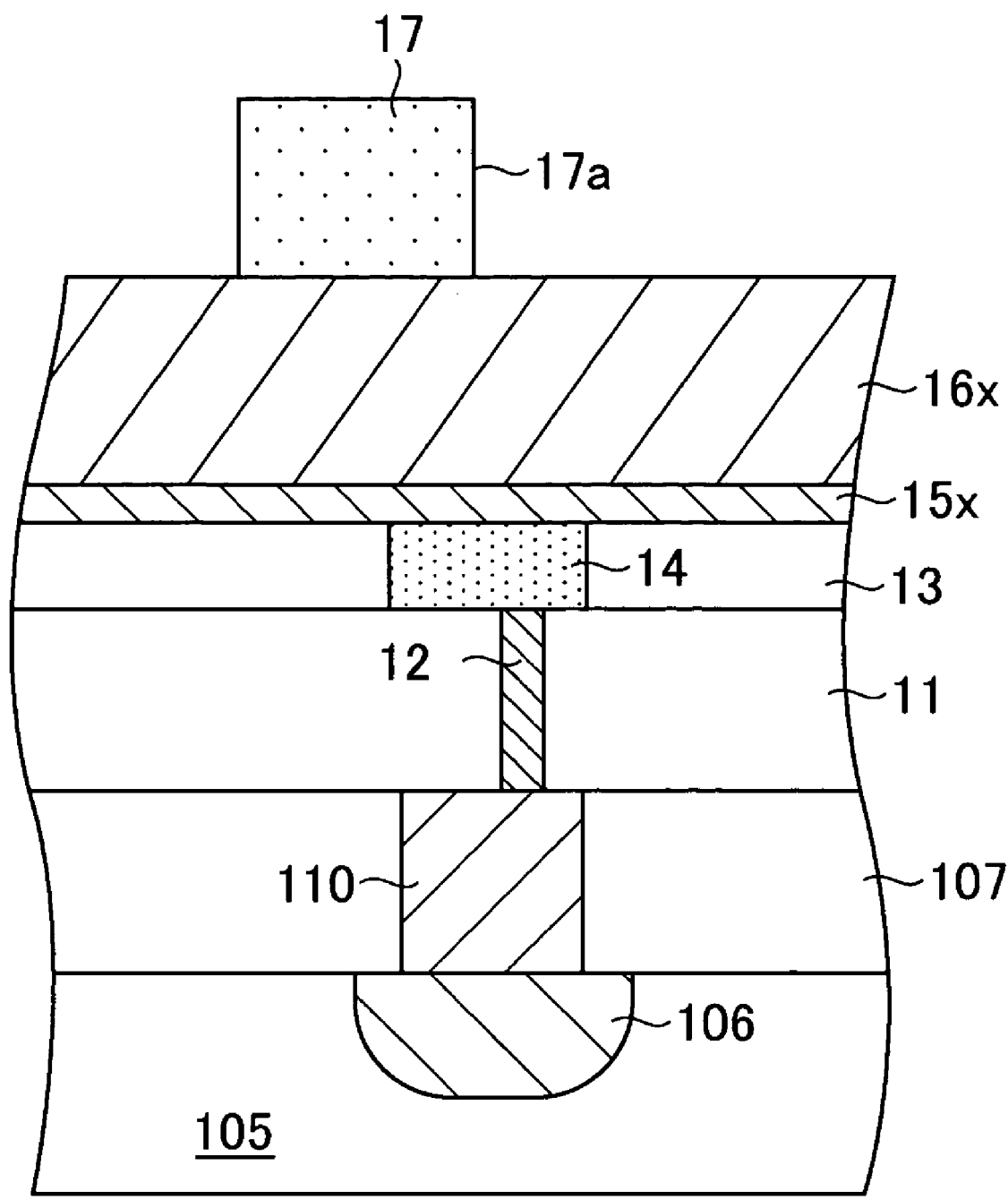
FIG. 22 is a process diagram showing a process of forming a conductive layer and a photoresist.

FIG. 20 to FIG. 22 are schematic plan views sequentially showing manufacturing steps of the non-volatile memory element 20. Each corresponds to the cross section taken along the line E-E shown in FIG. 17.

Firstly, as shown in FIG. 20, the through-hole 11a is formed in the interlayer insulation film 11, and the lower electrode 12 is formed inside the through-hole 11a. Thereafter, the recording layer 14 is formed at a position that contacts the lower electrode 12. Then, the interlayer insulation film 13x is formed on the entire surface, thereby completely covering the top surface and side surfaces of the recording layer 14.

Next, as shown in FIG. 21, the interlayer insulation film 13x is polished by CMP to expose the top surface 14b of the recording layer 14. Thus, the top surface 13b of the interlayer insulation film 13 and the top surface 14b of the recording layer 14 are flattened, thereby forming substantially the same plane. By the polishing, the interlayer insulation film 13x becomes flat to be the interlayer insulation film 13. In this embodiment, since it is possible to reduce the film thickness of the interlayer insulation film 13, the structure shown in FIG. 21 can be relatively easily obtained.

Next, the conductive layer 15x, which serves as a material for the upper electrode 15, and the conductive layer 16x, which serves as a material for the bit line, are formed in this order on the interlayer insulation film 13 and the recording layer 14, as shown in FIG. 22. Thereafter, the photoresist 17 is formed at a position to be offset to the recording layer 14. Using the photoresist 17 as a mask, the conductive layers 16x and 15x are patterned. Also in this embodiment, the edge 17a of the photoresist 17 traverses the recording layer 14. Therefore, only one portion of the recording layer 14 overlaps the photoresist 17. It is particularly preferable to form the photoresist 17 at a position not overlapping the lower electrode 12.

Thus, of the conductive layers 15x and 16x, any portion not covered with the photoresist 17 is removed. Finally, the photoresist 17 is removed by the ashing process. As a result, the structure shown in FIG. 18 is obtained. Also in this embodiment, formation surfaces of the conductive layers 15x and 16x, that is, the top surface 13b of the interlayer insulation film 13 and the top surface 14b of the recording layer 14, form a flat surface, so that a patterning can be performed with high accuracy.

According to such a method, the patterned upper electrode 15 and bit line 16 are formed at a position to be offset to the recording layer 14. As a result, a contact area between the recording layer 14 and the upper electrode 15 is reduced, and the distance between the phase change region P and the bit line 16 can be increased.

Figure 23:
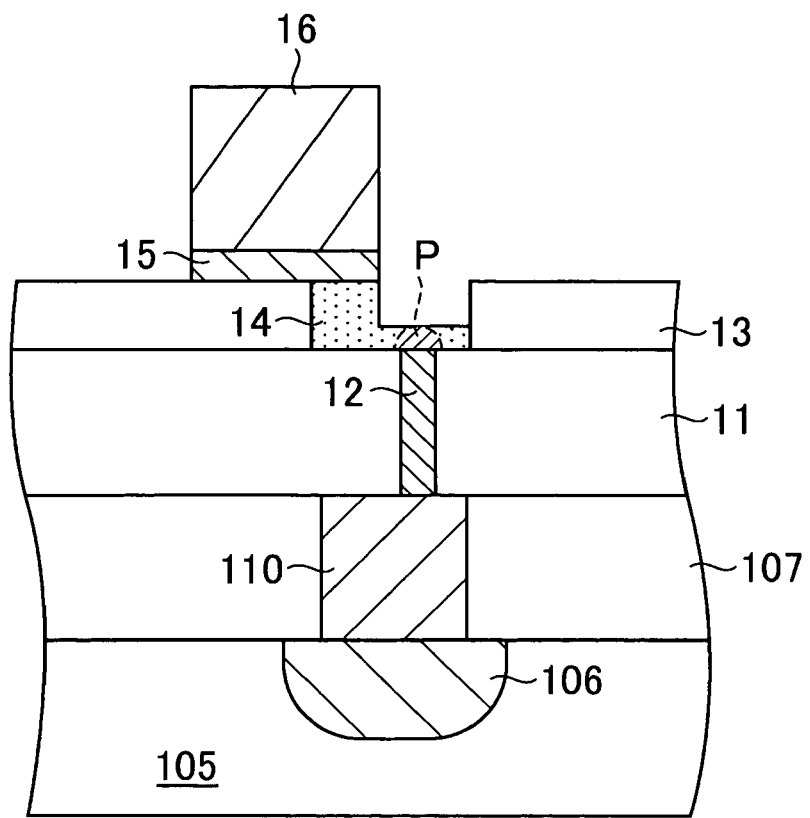
FIG. 23 is a schematic plan view of a structure of a non-volatile memory element according to a modified example of the second embodiment.

After the bit line 16 and the upper electrode 15 are patterned by using the photoresist 17, over-etching in which the photoresist 17 is continuously used can be performed. In this case, of the recording layer 14, any portion not covered with the upper electrode 15 and the bit line 16 is removed, as shown in FIG. 23, and thus, the film thickness of the concerned portion is reduced. As a result, the size of the phase change region P can be further reduced, and a heat radiation route to the bit line 16 side can be narrowed.

As described above, in the non-volatile memory element 20 according to this embodiment, the top surface 13b of the interlayer insulation film 13 and the top surface 14b of the recording layer 14 form a flat surface. The upper electrode 15 and the bit line 16 are formed so as to cover one portion of a boundary line between the recording layer 14 and the interlayer insulation film 13. Thus, it is possible to suppress heat radiation to the bit line 16 without reducing the contact area between the upper electrode 15 and the bit line 16.

In the above embodiment, after the through-hole 13a is formed in the interlayer insulation film 13, the recording layer 14 can be formed in the through-hole 13a. The shape of a plurality of upper electrodes 15 in which the bit line 16 is commonly used can be seamless.

A non-volatile memory element 30 according to a third preferred embodiment of the present invention will be described next.

Figure 24:
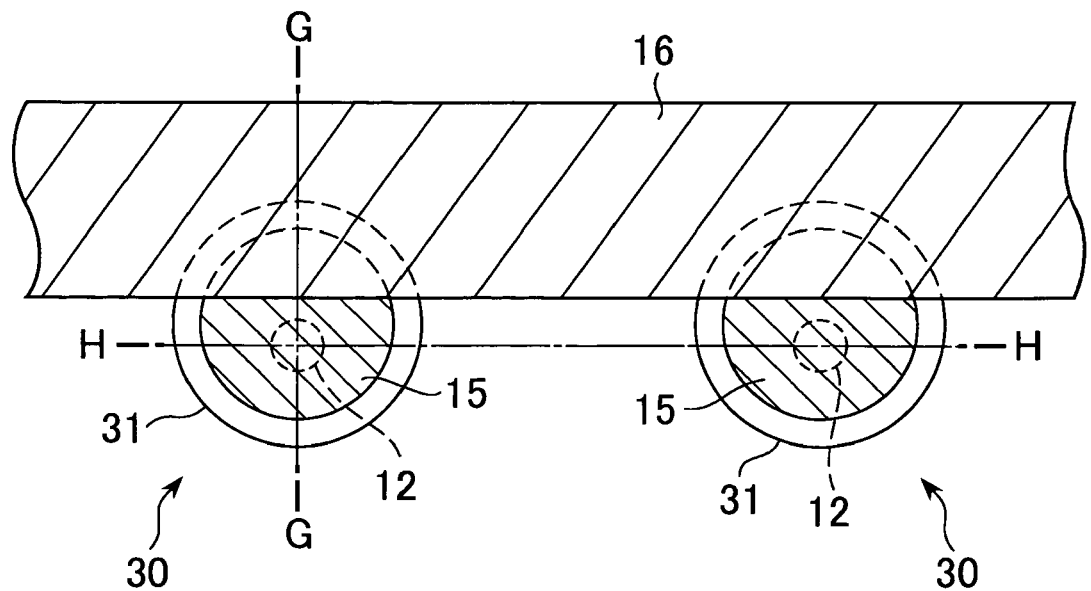
FIG. 24 is a schematic plan view of a structure of the non-volatile memory element according to a third embodiment of the present invention.
Figure 25:
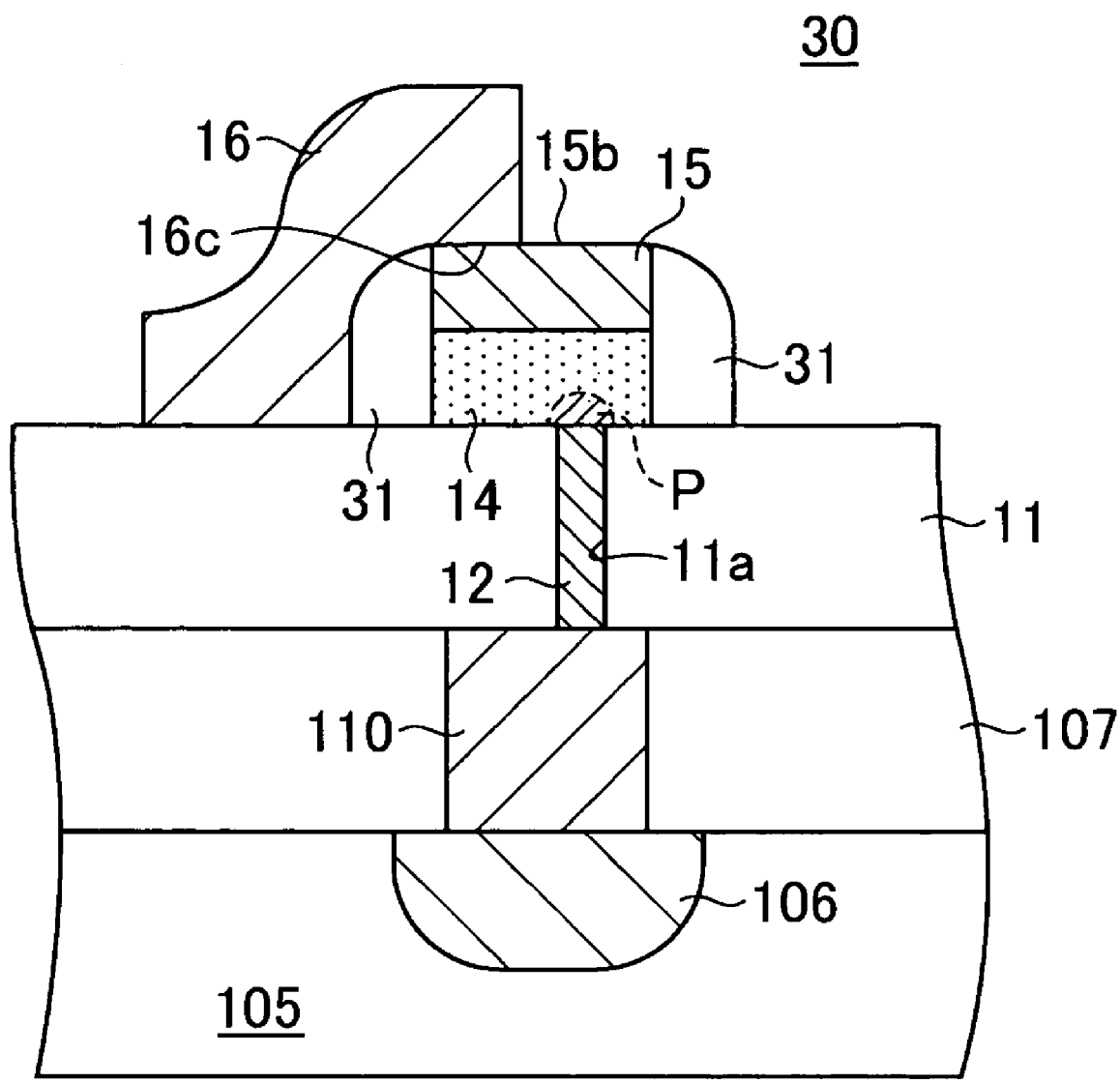
FIG. 25 is a schematic cross section taken along a line G-G shown in FIG. 24.
Figure 26:
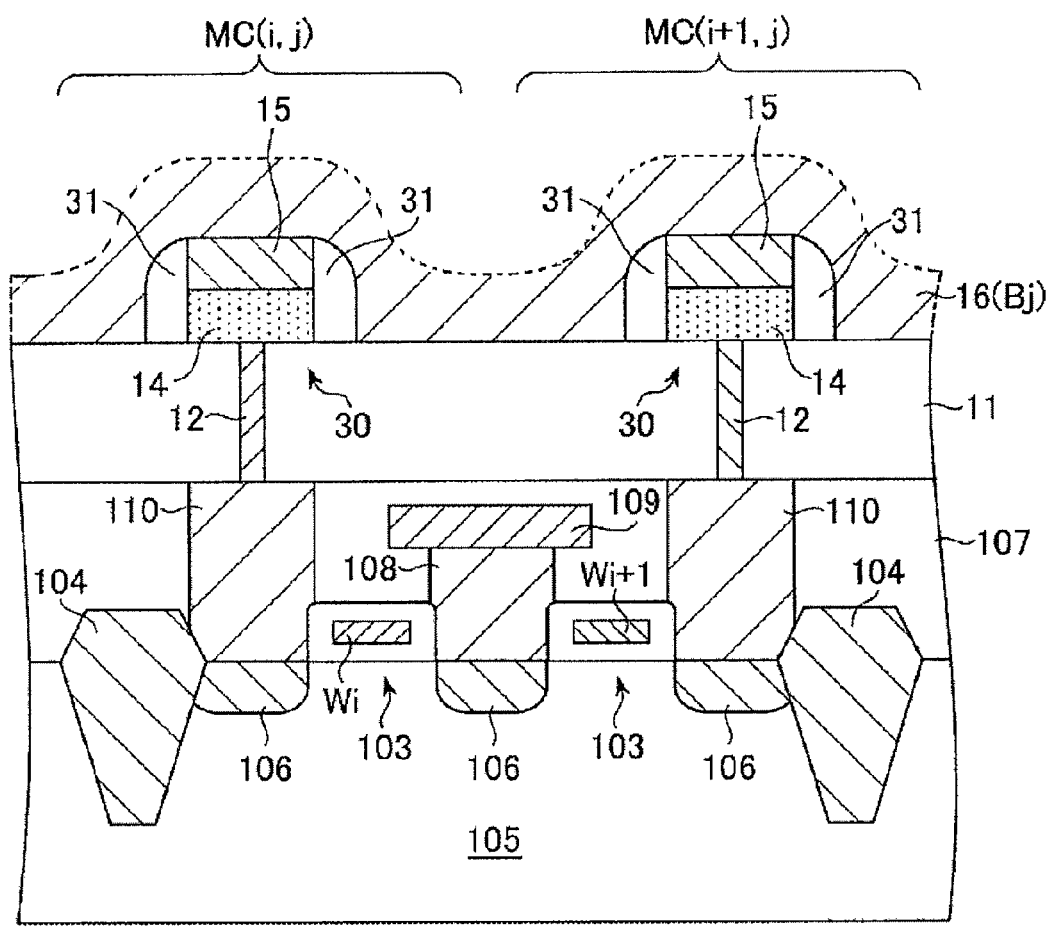
FIG. 26 is a schematic cross section taken along a line H-H shown in FIG. 24.

FIG. 24 is a schematic plan view of a structure of the non-volatile memory element 30 according to the third embodiment of the present invention. FIG. 25 is a schematic cross section taken along a line G-G shown in FIG. 24. FIG. 26 is a schematic cross section taken along a line H-H shown in FIG. 24. FIG. 26 shows a structure of a memory cell that uses the non-volatile memory element 30 according to this embodiment.

The non-volatile memory element 30 according to this embodiment is different from the non-volatile memory element 10 according to the first embodiment in that side surfaces of the recording layer 14 and the upper electrode 15 are not covered with an interlayer insulation film but are covered with a sidewall insulation layer 31. The remaining respects of the non-volatile memory element 30 are the same as those of the non-volatile memory element 10 according to the first embodiment. Therefore, like reference numerals denote like parts, and redundant explanations thereof will be omitted.

In this embodiment, the bit line 16 is formed so as to cover one portion of a boundary line between the upper electrode 15 and the sidewall insulation layer 31, as shown in FIG. 25. That is, the bit line 16 is formed so that the edge thereof traverses the upper electrode 15. Thus, one portion of the bottom surface 16c of the bit line 16 contacts one portion of the top surface 15b of the upper electrode 15. The remaining portion thereof contacts the sidewall insulation layer 31 and the interlayer insulation film 11. The remaining portion of the top surface 15b of the upper electrode 15 does not contact the bit line 16. Thus, in this embodiment, similarly to the first embodiment, the bit line 16 is arranged to be offset to the recording layer 14. As a result, a contact area between the bit line 16 and the upper electrode 15 is reduced, and the distance between the phase change region P and the bit line 16 can be increased.

A manufacturing method of the non-volatile memory element 30 according to this embodiment will be described next.

Figure 27:
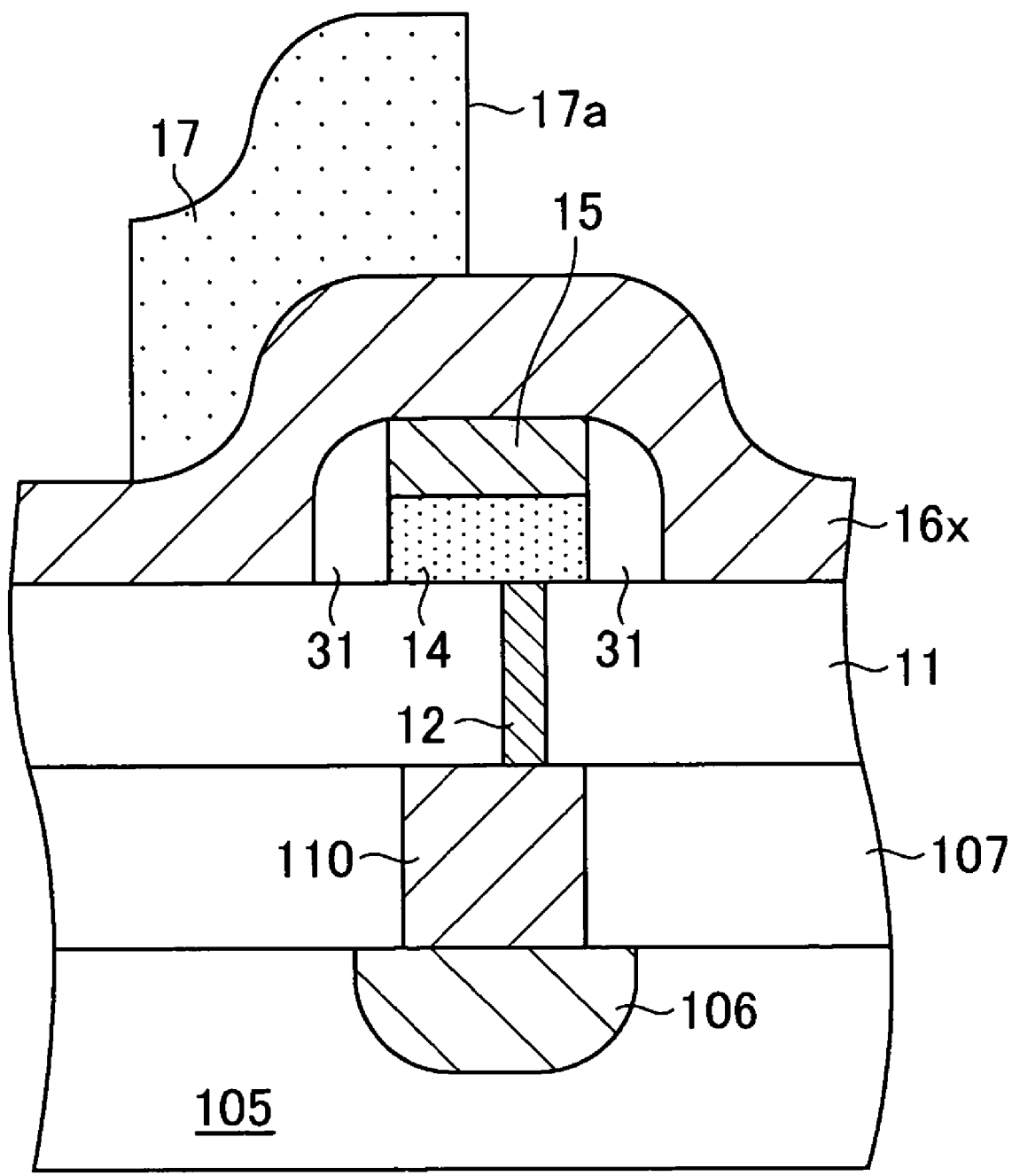
FIG. 27 is a process diagram showing a process of forming a conductive layer and a photoresist.

First, through the process shown in FIG. 6, a laminate consisting of the recording layer 14 and the upper electrode 15 is completely covered with the interlayer insulation film 13x. Thereafter, the interlayer insulation film 13x is etched back to form the sidewall insulation layer 31 on side surfaces formed by the recording layer 14 and the upper electrode 15, as shown in FIG. 27. In the etching back of the interlayer insulation film 13x, it is necessary to perform etch back until the top surface of the upper electrode 15 is exposed. In this case, as a material for the interlayer insulation film 11 and that of the interlayer insulation film 13x, if materials of which etching rates vary with each other are selected, the interlayer insulation film 11 is not easily over-etched at the time of etching back the interlayer insulation film 13x.

Next, the conductive layer 16x, which serves as a material for the bit line, is formed on the entire surface, as shown in FIG. 27. Thereafter, the photoresist 17 is formed at a position to be offset to the recording layer 14, and the conductive layer 16x is patterned by using the photoresist 17 as a mask. In this embodiment also, the edge 17a of the photoresist 17 traverses the recording layer 14. Therefore, only one portion of the recording layer 14 overlaps the photoresist 17. It is particularly preferable to form the photoresist 17 at a position not overlapping the lower electrode 12. Thus, of the conductive layer 16x, any portion not covered with the photoresist 17 is removed. Finally, the photoresist 17 is removed by the ashing process, thereby obtaining the structure shown in FIG. 25.

Since this embodiment does not require a process for embedding the recording layer 14 and the upper electrode 15 within the through-hole, a CMP process in which inplane uniformity is difficult to obtain can be eliminated.

Figure 28:
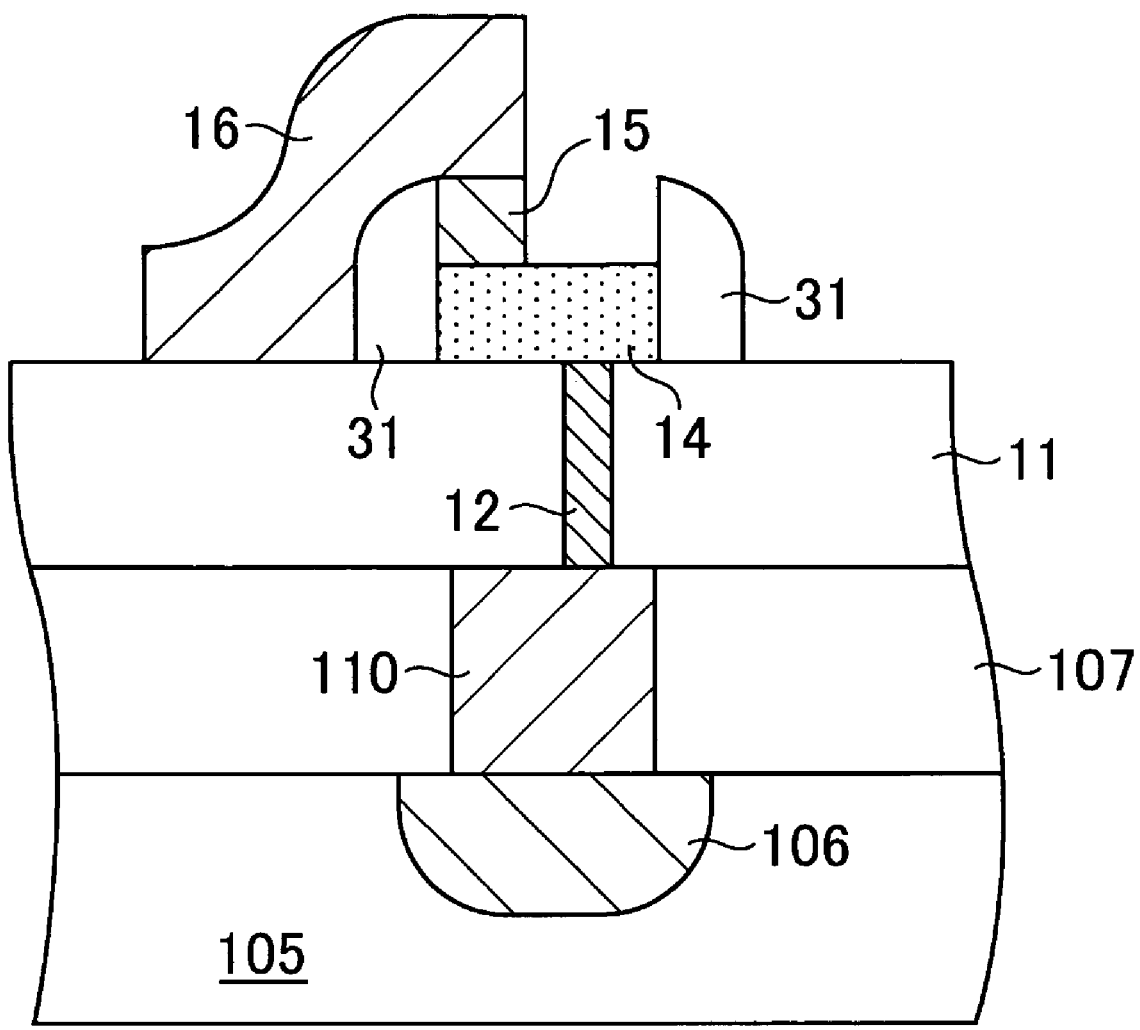
FIG. 28 is a schematic plan view of a structure of a non-volatile memory element according to a modified example of the third embodiment.

It is to be noted that of the upper electrode 15, any portion not covered with the bit line 16 can be removed by patterning the bit line 16 by using the photoresist 17, followed by performing over-etching in which the photoresist 17 is continuously used. When such over-etching is performed, the upper electrode 15 remains only in a region where the recording layer 14 and the bit line 16 overlap, as shown in FIG. 28. With this configuration, not only a contact area between the upper electrode 15 and the bit line 16 but also a contact area between the recording layer 14 and the upper electrode 15 can be reduced. Therefore, the heat radiation to the bit line 16 side can be further reduced.

The removal of the upper electrode 15 by the over-etching needs not be performed until the recording layer 14 is exposed, and can be performed only to the extent that one portion of a portion not covered with the bit line 16 is removed, and a film thickness in the concerned portion is thereby reduced, as described with reference to FIG. 10.

As described above, in the non-volatile memory element 30 of this embodiment, the side surfaces formed by the recording layer 14 and the upper electrode 15 are covered with the sidewall insulation layer 31, and the bit line 16 is formed so that the edge thereof traverses the top surface 15b of the upper electrode 15. Therefore, it is possible to reduce the contact area between the upper electrode 15 and the bit line 16 without providing the interlayer insulation film between the upper electrode 15 and the bit line 16. Thus, it is possible to suppress heat radiation to the bit line 16 while connecting the upper electrode 15 and the bit line 16 without using a through-hole.

Also in the above embodiment, the shape of a plurality of recording layers 14 and upper electrodes 15 in which the bit line 16 is commonly used can be seamless.

The present invention is in no way limited to the aforementioned embodiments, but rather various modifications are possible within the scope of the invention as recited in the claims, and naturally these modifications are included within the scope of the invention.

In each of the embodiments, the upper electrode 15 and the bit line 16 have a single-layered structure, for example. However, the structures of the upper electrode and the bit line are not limited thereto. The upper electrode 15 and the bit line 16 can have a multi-layered structure consisting of a plurality of conductive layers. Therefore, even when a conductive layer of some sort (bonding layer, for example) exists between a main body portion of the upper electrode 15 and that of the bit line 16, the conductive layer can be considered one portion of the upper electrode 15 or one portion of the bit line 16. In this case also, it can be considered that the upper electrode 15 and the bit line 16 are "directly" contacted.

As described above, according to the present invention, it is possible to reduce a contact area between the recording layer and the upper electrode or a contact area between the upper electrode and the bit line without providing the interlayer insulation film between the upper electrode and the bit line. Thus, it is possible to suppress heat radiation to the bit line while connecting the upper electrode and the bit line without using a through-hole.

What is claimed is:

1. A non-volatile memory element, comprising:
a lower electrode;
an upper electrode;
a recording layer containing a phase change material arranged between the lower electrode and the upper electrode; and
a bit line substantially directly arranged on the upper electrode, wherein
the bit line is offset to the recording layer.

2. The non-volatile memory element as claimed in claim 1, further comprising an interlayer insulation film, wherein
a top surface of the interlayer insulation film and a top surface of the upper electrode form substantially a same plane, and
the bit line is formed so as to cover one portion of a boundary line between the upper electrode and the interlayer insulation film.

3. The non-volatile memory element as claimed in claim 1, further comprising a sidewall insulation layer for covering side surfaces of the recording layer and the upper electrode, wherein
the bit line is formed so as to cover one portion of a boundary line between the upper electrode and the sidewall insulation layer.

4. The non-volatile memory element as claimed in claim 2, wherein the upper electrode is formed only in a region where the recording layer and the bit line overlap.

5. The non-volatile memory element as claimed in claim 1, further comprising an interlayer insulation film, wherein
a top surface of the interlayer insulation film and a top surface of the recording layer form substantially a same plane, and
the upper electrode is formed so as to cover one portion of a boundary line between the recording layer and the interlayer insulation film.

6. The non-volatile memory element as claimed in claim 5, wherein a film thickness of the recording layer in a region that does not overlap the bit line is thinner than a film thickness of the recording layer in a region that overlap the bit line.

7. The non-volatile memory element as claimed in claim 1, wherein the bit line is offset to the recording layer so that the lower electrode and the bit line do not overlap.

8. A non-volatile memory element, comprising:
an interlayer insulation film having a through-hole;
a recording layer containing a phase change material formed in the through-hole;
a lower electrode connected to a bottom surface of the recording layer;
an upper electrode connected to a top surface of the recording layer; and
a bit line arranged on the interlayer insulation film and connected to the upper electrode, wherein
at least one of the upper electrode and the bit line is formed so that the edge traverses the through-hole.

9. The non-volatile memory element as claimed in claim 8, wherein the upper electrode is formed in the through-hole, and an edge of the bit line is formed so as to traverse the through-hole.

10. The non-volatile memory element as claimed in claim 8, wherein the upper electrode is arranged on the interlayer insulation film, and edges of both the upper electrode and the bit line are formed so as to traverse the through-hole.

11. A non-volatile memory element, comprising:
a recording layer containing a phase change material, and having a plug shape;
a lower electrode in contact with a part of a bottom surface of the recording layer; and
a laminate wiring layer of an upper electrode and a bit line being on the upper electrode,
wherein the laminate wiring layer is in contact with a part of a top surface of the recording layer, and an edge of the laminate wiring later intersects with the top surface of the recording layer.

12. The non-volatile memory element as claimed in claim 11, wherein an electric resistance of the upper electrode is higher than an electric resistance of the bit line.

13. The non-volatile memory element as claimed in claim 11, wherein a film thickness of the recording layer in a region that contacts with the laminate wiring layer is thinker than a film thickness of the recording layer in a region that does not contact with the laminate wiring layer.

* * * * *